(12) United States Patent
McMillan et al.

(10) Patent No.: US 8,338,924 B2
(45) Date of Patent: Dec. 25, 2012

(54) SUBSTRATE FOR INTEGRATED CIRCUIT PACKAGE WITH SELECTIVE EXPOSURE OF BONDING COMPOUND AND METHOD OF MAKING THEREOF

(75) Inventors: John Robert McMillan, Fontana, CA (US); Xiao Yun Chen, Shenzhen (CN); Tung Lok Li, Hong Kong (CN)

(73) Assignee: QPL Limited, Hksar (CN)

( * ) Notice: Subject to any disclaimer, the term of this patent is extended or adjusted under 35 U.S.C. 154(b) by 0 days.

(21) Appl. No.: 13/253,995

(22) Filed: Oct. 6, 2011

(65) Prior Publication Data

US 2012/0146199 A1 Jun. 14, 2012

Related U.S. Application Data

(63) Continuation-in-part of application No. 13/111,981, filed on May 20, 2011.

(60) Provisional application No. 61/421,616, filed on Dec. 9, 2010.

(51) Int. Cl.
*H01L 23/495* (2006.01)

(52) U.S. Cl. ........ 257/666; 257/676; 257/782; 438/123; 438/118

(58) Field of Classification Search .................. 257/666, 257/676, 787, 782, 783; 438/123, 111, 112
See application file for complete search history.

(56) References Cited

U.S. PATENT DOCUMENTS

| | | | | |
|---|---|---|---|---|
| 5,329,158 A | * | 7/1994 | Lin | 257/666 |
| 6,703,696 B2 | * | 3/2004 | Ikenaga et al. | 257/678 |
| 8,106,492 B2 | * | 1/2012 | Chang Chien et al. | 257/676 |
| 2008/0079127 A1 | * | 4/2008 | Gerber | 257/676 |
| 2010/0258921 A1 | * | 10/2010 | Chang Chien et al. | 257/676 |
| 2010/0320588 A1 | * | 12/2010 | Dahilig et al. | 257/690 |

\* cited by examiner

*Primary Examiner* — S. V. Clark
(74) *Attorney, Agent, or Firm* — Eagle IP Limited; Jacqueline C. Lui

(57) ABSTRACT

A substrate for integrated circuit package is disclosed. The substrate comprises an electrically conductive leadframe having a first side and an opposing second side. The substrate has a first bonding compound disposed in a first recessed portion of the first side and a second bonding compound disposed in at least a portion of a second recessed portion of the leadframe, selectively exposing a selected area of the leadframe on the second side. In an exemplary embodiment, the second bonding compound is a photolithographic material. A method of manufacturing a substrate for integrated circuit package is also disclosed.

24 Claims, 34 Drawing Sheets

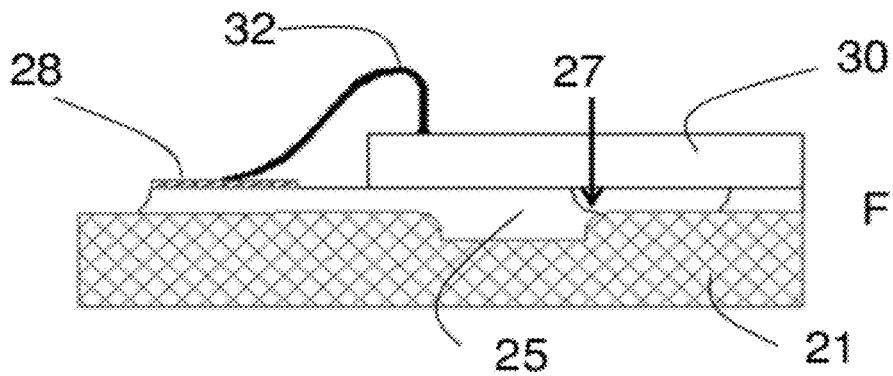
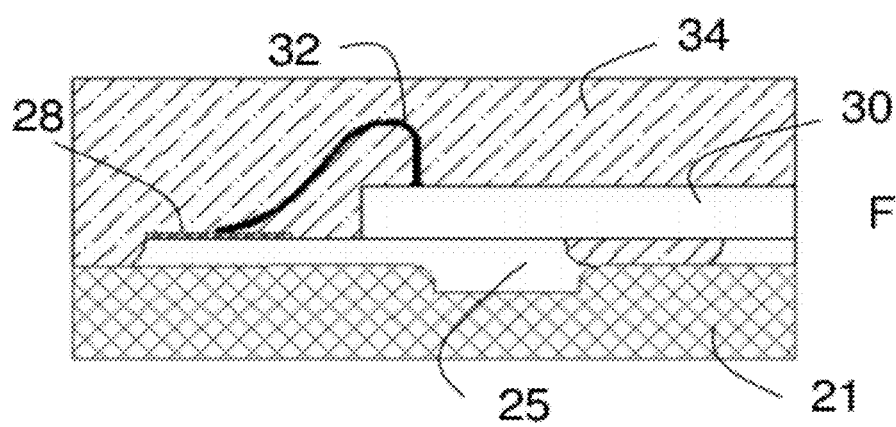
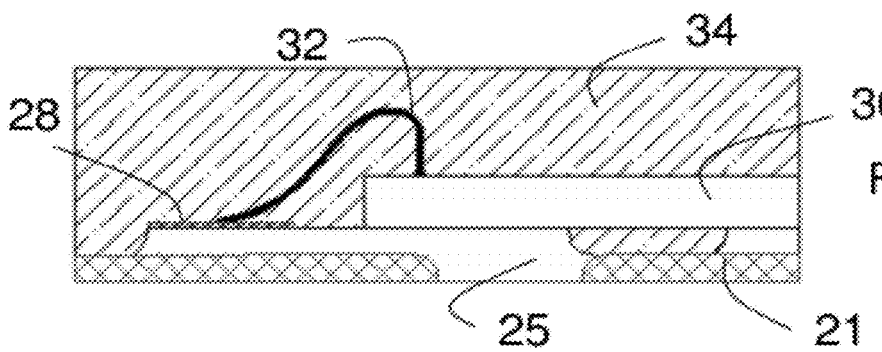
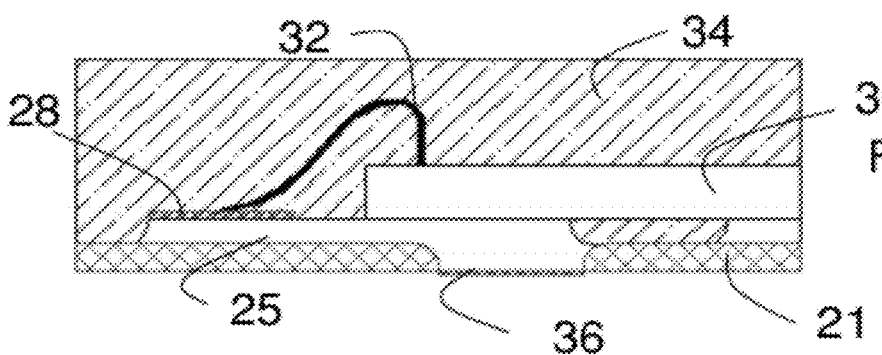

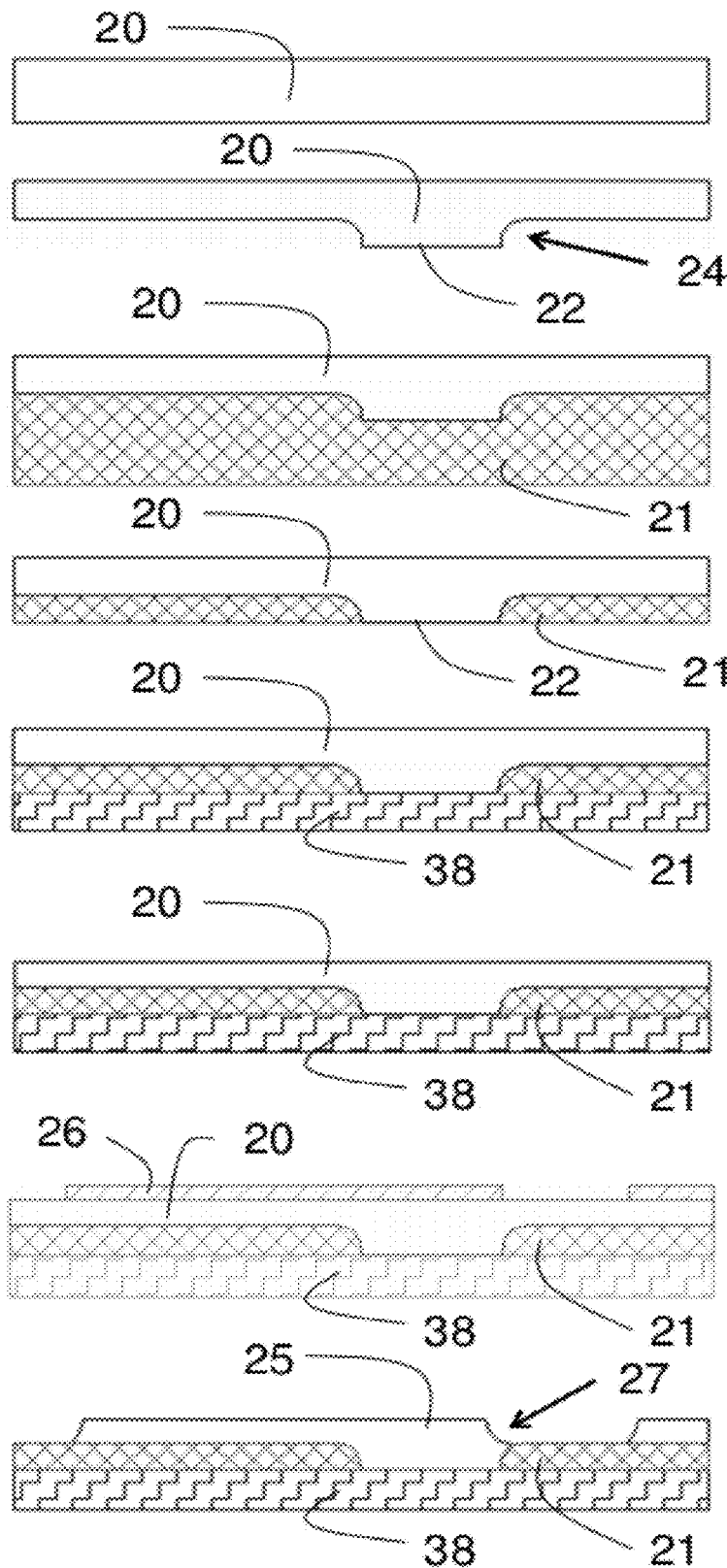

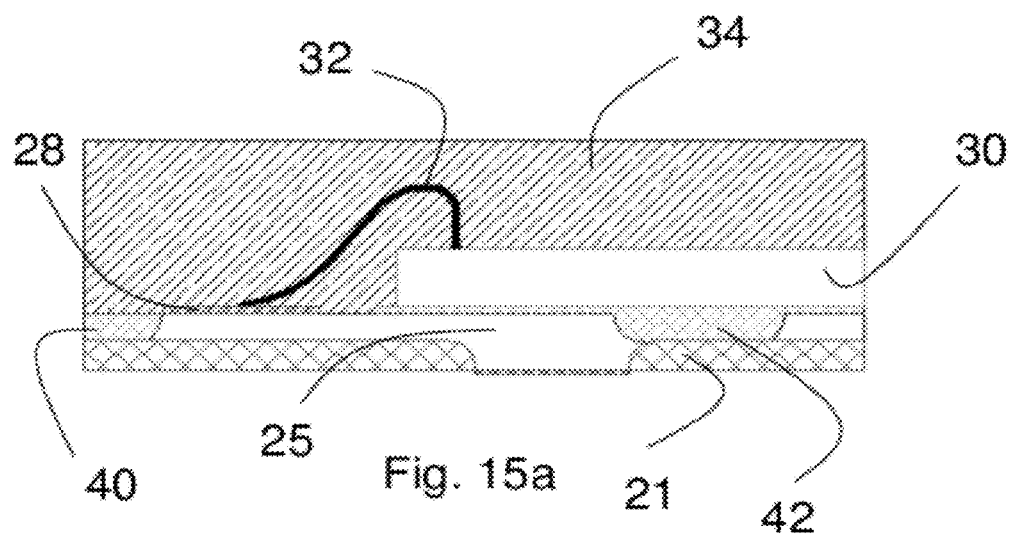
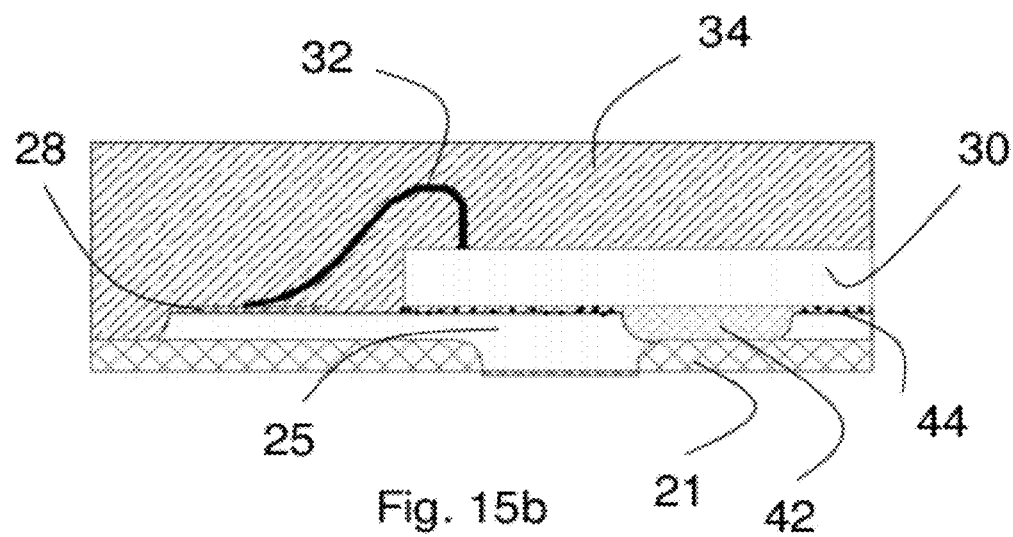

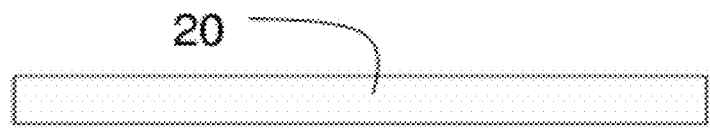
Fig. 17a
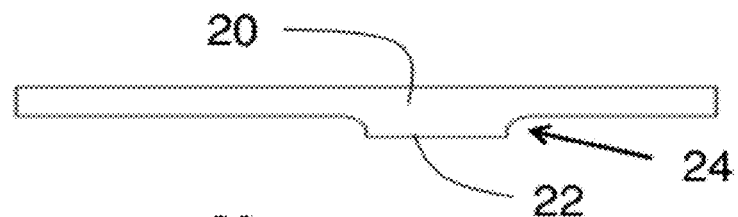
Fig. 17b
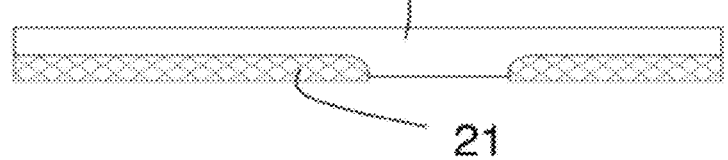
Fig. 17c
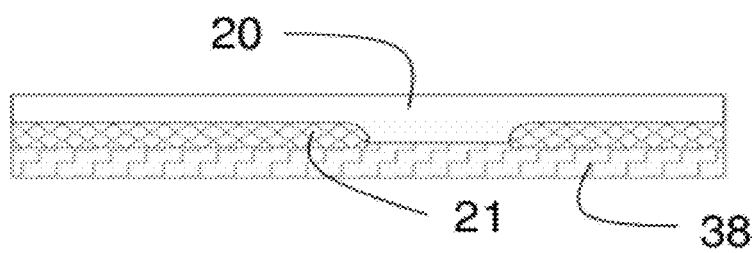
Fig. 17d
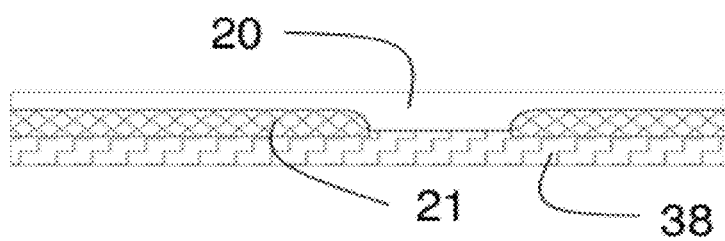
Fig. 17e
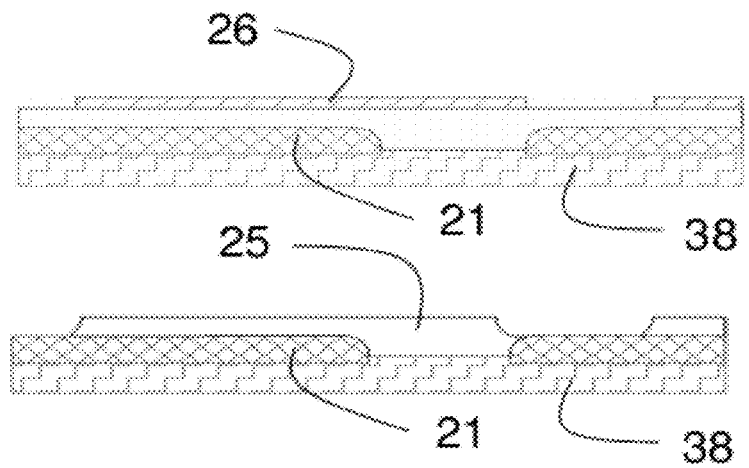
Fig. 17f
Fig. 17g

SUBSTRATE FOR INTEGRATED CIRCUIT PACKAGE WITH SELECTIVE EXPOSURE OF BONDING COMPOUND AND METHOD OF MAKING THEREOF

CROSS-REFERENCE TO RELATED APPLICATION

This application is a continuation-in-part application of U.S. Non-provisional application having Ser. No. 13/111,981 filed on May 20, 2011, which claims benefit under 35 U.S.C. §119(e) of U.S. Provisional Application having Ser. No. 61/421,616 filed on Dec. 9, 2010, which are hereby incorporated by reference herein in its entireties.

FIELD OF INVENTION

This invention relates to an integrated circuit (IC) package, and in particular an IC package having a substrate with more than one encapsulation compound.

BACKGROUND OF INVENTION

Encapsulation compound in conventional substrates for IC packages are made of an epoxy material. The shape of such epoxy material is difficult to be customized, especially for a non-planar profile. In particular, it is difficult to selectively expose a part of a leadframe while covering another part of the leadframe on the same surface.

SUMMARY OF INVENTION

In the light of the foregoing background, it is an object of the present invention to provide an alternate substrate for integrated circuit package and a method of making thereof.

Accordingly, the present invention, in one aspect, is a substrate for integrated circuit package comprising an electrically conductive leadframe having a first side and an opposing second side, the leadframe comprising a plurality of lands on the first side, a first recessed portion between the plurality of lands, a plurality of electrically isolated bonding points on the second side with each bonding point being electrically connected to one of the plurality of lands, and a second recessed portion between the plurality of bonding points. The substrate also has a first bonding compound disposed in the first recessed portion and exposing the plurality of lands, and a second bonding compound disposed in the second recessed portion and on the second side of said leadframe, selectively exposing a selected area of the leadframe on the second side. The first bonding compound and the second bonding compound hold the plurality of bonding points and the plurality of lands together.

In an exemplary embodiment of the present invention, the second bonding compound is a photolithographic material.

In one embodiment of the present invention, the leadframe further comprises at least one routing lead on the second side of the leadframe, each routing lead electrically connecting one of the plurality of bonding points to one of the plurality of lands, wherein the second bonding compound selectively exposes the at least one routing lead.

In an exemplary embodiment of the present invention, the selected area is subjected to an adhesion enhance treatment.

In another exemplary embodiment, the leadframe further comprises at least one pedestal structure extending towards the first side of the leadframe. A distal end of the pedestal structure is coplanar to the plurality of lands and covered by the first bonding compound.

In a further embodiment, each pedestal structure is formed directly opposite to one of the plurality of bonding points.

According to another aspect of the present invention, a method of manufacturing a substrate for integrated circuit package is disclosed. The method patterns a leadframe on a first side forming a plurality of lands and a first recessed portion between the plurality of lands. The method then disposes a first bonding compound on the first side of the leadframe, the first bonding compound filling the first recessed portion and exposing the plurality of lands. The method also patterns the leadframe on an opposing second side forming a plurality of electrically isolated bonding points and a second recessed portion between the plurality of bonding points, and disposes a second bonding compound on the second side of the leadframe, the second bonding compound filling the second recessed portion and selectively exposing a selected area on the second side of the leadframe.

In a variation of the above method, the method further subjects the selected area to an adhesion enhancement treatment.

In a further exemplary embodiment, the method also forms a pedestal structure when patterning the first side of the leadframe.

There are many advantages to the present invention. One advantage is that the second bonding compound can be selectively exposed on a selected area of user choice while keeping the unselected area covered. If a photolithographic material is used as the second bonding compound, this is achievable even though some parts of the selected area and the unselected area may be on a same horizontal level. This allows a greater extent of customization of the substrate for improvements in performance, such as disposing an adhesion enhancement layer on the selected area for improved adhesion to an encapsulation compound. The photolithographic material is thick enough to have enough strength for holding the leadframe together during the manufacturing process. Having a support ring around the substrates also reduces warpage of the substrates due to thermal expansion during manufacturing process.

Another advantage of the present invention is that the pedestal structure improves the surface area of the routing lead for improved holding strength to a bonding compound, preventing the bonding point from peeling away from the substrate. The added volume of the routing lead can also move the center of gravity of the routing lead towards the center of the leadframe, making the leadframe more stable. The undercut of the pedestal structure further provides physical interlocking with the bonding compound.

BRIEF DESCRIPTION OF FIGURES

FIG. 2a-2k is a cross-sectional view of an integrated circuit chip package at different steps of the process of FIG. 1.

FIG. 6a-6m is a cross-sectional view of an integrated circuit chip package at different steps of the process of FIG. 5.

FIG. 15a is a cross-sectional view of an IC package showing a die attach material filling the second recessed portion and attaching to the semiconductor die, according to an embodiment of the present invention.

FIG. 15b is a cross-sectional view of an IC package showing separate die attach materials filling the second recessed portion and attaching to the semiconductor die, according to an embodiment of the present invention.

FIG. 17a-l is a cross-sectional view of an integrated circuit chip package at different steps of the process of FIG. 16.

FIG. 20b is a cross-sectional view of the substrate of FIG. 20a.

FIG. 21a is a top view of a substrate showing a selectively disposed second bonding compound, according to another embodiment of the present invention.

FIG. 21b is a cross-sectional view of the substrate of FIG. 21a.

FIG. 22b is a cross-sectional view of the substrate of FIG. 22a.

FIG. 25b is a top view of the System-in-Package device of FIG. 25a.

DETAILED DESCRIPTION OF THE PREFERRED EMBODIMENTS

As used herein and in the claims, "comprising" means including the following elements but not excluding others.

As used herein and in the claims, "couple" or "connect" refers to electrical coupling or connection either directly or indirectly via one or more electrical means unless otherwise stated.

As used herein and in the claims, "leadframe" or "substrate leadframe" means a structure made from an electrically conductive material, where other materials and compounds are added thereon to form a substrate. A "substrate" means a structure having a leadframe and additional materials or compounds, where a semiconductor die is attached thereto to form an IC package.

Figure 1:
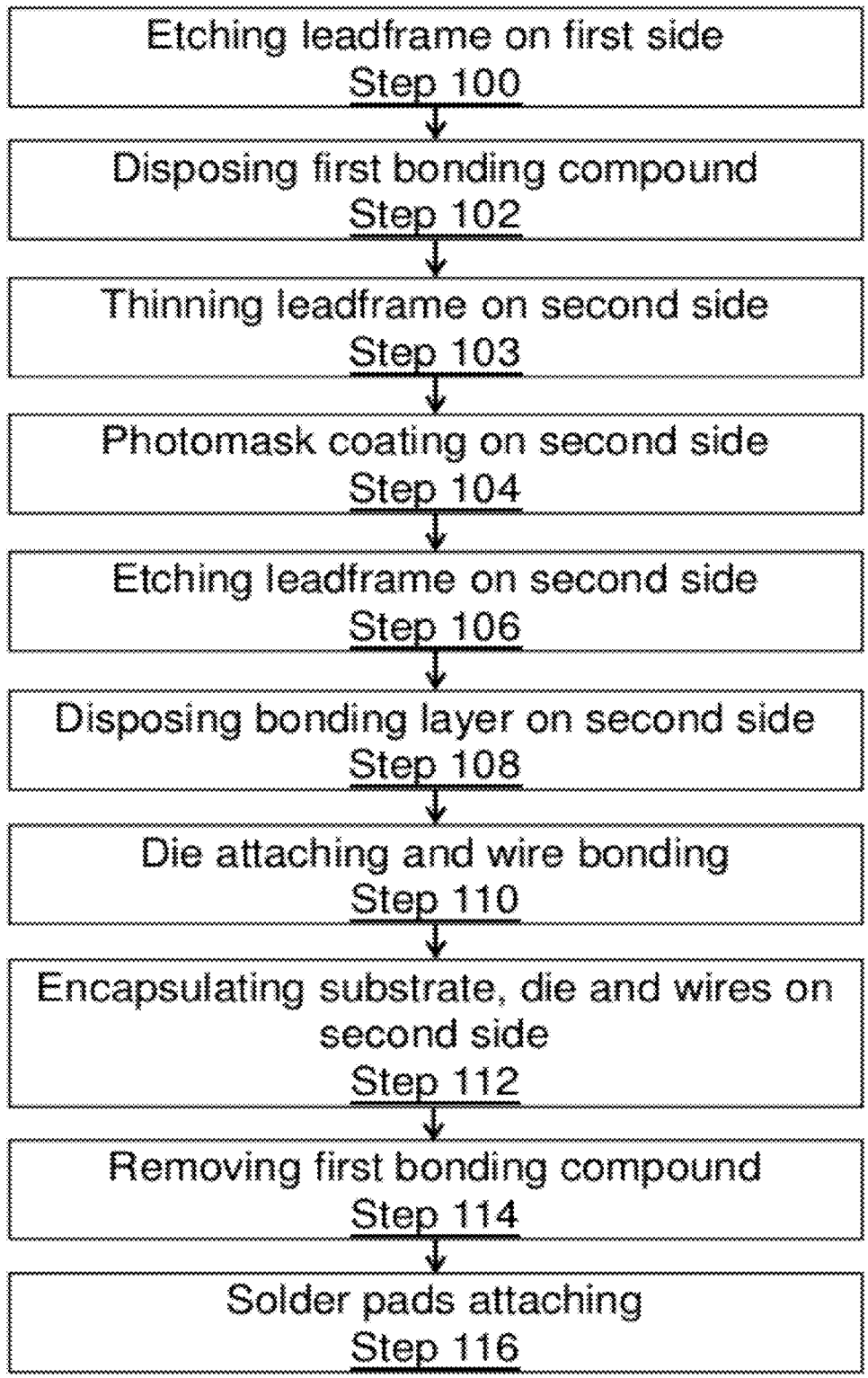
FIG. 1 is a flow chart of a process of manufacturing an integrated circuit chip package according to an embodiment of the present invention.
Figure 2A:
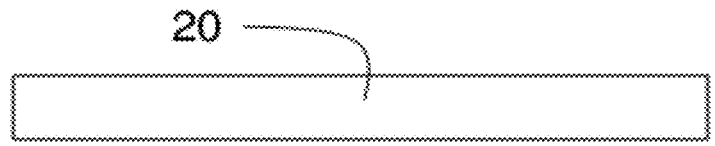
Figure 2B:
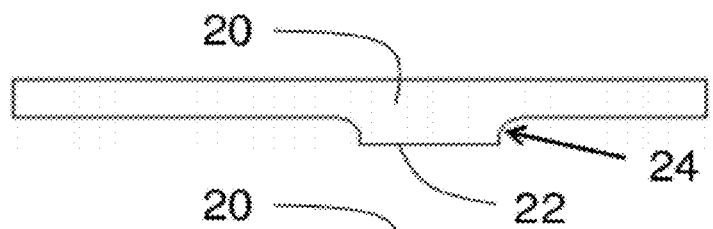

FIGS. 1 and 2a-2h shows a method of manufacturing a substrate and an IC package according to a first embodiment of the present invention. FIG. 2a shows an electrically conductive substrate leadframe 20, made from copper for example, at its initial state. In step 100, a first portion of the leadframe 20 is etched at a first side thereof to form a first pattern on the first side. The first pattern comprises a plurality of lands 22 on the surface of the first side, adapted to electrically connect to an external device, such as a printed circuit board, and also comprises a first recessed portion 24 which is recessed relative to the plurality of lands 22. The first pattern can alternately be called as the landing pattern. The substrate after step 100 is shown in FIG. 2b.

Figure 2C:
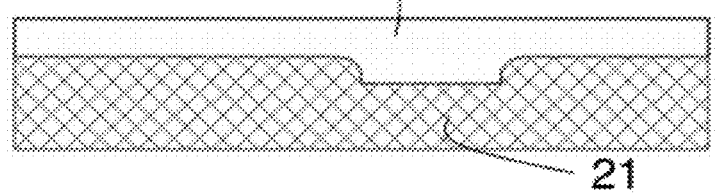

In step 102, a first bonding compound 21 is disposed on the first side of the leadframe 20. The bonding compound 21 fills the first recessed portion 24 and also covers the plurality of lands 22. In an exemplary embodiment, the first bonding compound 21 comprises a first portion that fills the first recessed portion 24 and being coplanar to the lands 22, and a second portion that extends beyond the first portion, covering the first recessed portion 24 and also the plurality of lands 22. In an exemplary embodiment, the first portion of the first bonding compound 21 is coplanar to the plurality of lands 22 at the first side of the leadframe 20. In an exemplary embodiment, the first bonding compound 21 covers the plurality of lands 22 by a predetermined thickness depending on various factors such as the size of the leadframe 20 and the depth of the first recessed portion 24. This step is also called pre-bonding, and the presence and the thickness of the first bonding compound 21 improves the ability to hold the leadframe 20 in place during subsequent steps of the manufacturing process, thereby preventing displacement of certain portions of the leadframe 20 as discussed below. The substrate after step 102 is shown in FIG. 2c.

Figure 2D:
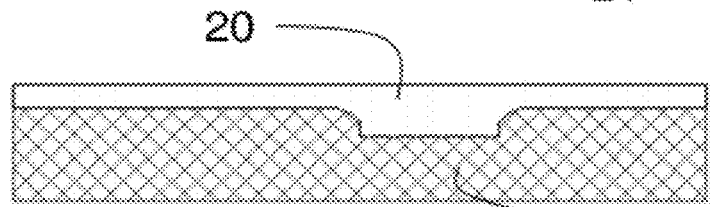

In one embodiment, in step 103 the leadframe 20 is optionally thinned to a desired thickness. The thinning step can be performed either by etching the leadframe 20 from the second surface or other known methods. The substrate after step 103 is shown in FIG. 2d.

Figure 2E:
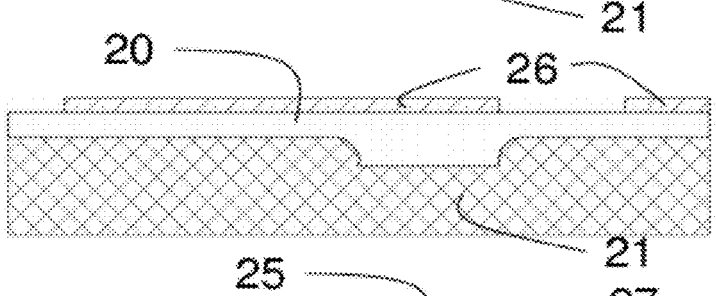

In step 104, a photomask 26 is coated onto the leadframe 20 at a second side of the leadframe. The photomask 26 defines a second pattern on the second side of the leadframe 20. In one embodiment, the second pattern comprises a plurality of routing leads 25, each leading from a bonding site to a corresponding land 22, and also comprises a second recessed portion 27 between and recessed relative to the routing leads 25. The photomask 26 can for example be blue ink or other materials known in the art. The substrate after step 104 is shown in FIG. 2e.

Figure 2F:
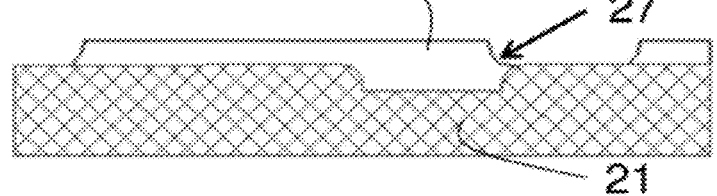

In step 106, the leadframe 20 is etched at the second side of the leadframe 20 to form the second pattern, or called the routing pattern. This etching process continues until the leadframe 20 is completely etched away at portions that are neither covered by the photomask 26 nor filled with the first bonding compound 21 at the first side, i.e. the second recessed portion 27 is adjoining the first recessed portion 24. This step reveals individual routing leads 25, with the first bonding compound 21 and the second recessed portion 27 completely surrounding each individual routing lead 25 thereby electrically separating the plurality of routing leads 25. The unmasked portion of the photomask 26 becomes the second recessed portion 27 between the plurality of routing leads 25 after etching. After this etching step, the first bonding compound 21 filling the first recessed portion 24 is exposed from the second side, and the plurality of routing leads 25 are held together only by the first bonding compound 21, as the leadframe 20 between the routing leads 25 is completely etched away and became the second recessed portion 27. Therefore, the first bonding compound 21 needs to be thick enough to prevent falling off or displacement of the routing leads 25. After etching, the photomask 26 is removed by conventional methods. The substrate after step 106 is shown in FIG. 2f.

Figure 2G:
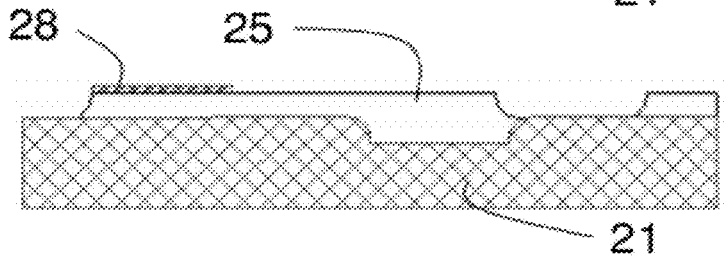

In step 108, a bonding layer is disposed on the leadframe 20 at the second side, forming a plurality of bonding pads 28 on the plurality of bonding sites on the routing leads 25 for bonding to at least one semiconductor die. In various embodiments, the bonding pads 28 are made of gold, silver, nickel palladium gold or other metals or alloys known in the art. In a preferred embodiment, the disposition of the bonding layer is performed by electroless plating. In general, the substrate is considered finished when it has reached the state just before the die attaching step, for example as shown in FIG. 2g. The subsequent steps starting from the die attaching step are referred to as the IC packaging steps.

In step 110, the semiconductor die 30 is attached onto the leadframe 20 at the second side, and the semiconductor die 30 is bonded to the plurality of bonding pads 28 through a plurality of bonding wires 32. In an exemplary embodiment, the semiconductor die 30 is disposed on and physically attached to at least one routing lead 25 through an electrically insulating die attach pad (not shown). The semiconductor die 30 is electrically connected to the routing leads 25 through the bonding wires 32 and the bonding pads 28 where the bonding pads 28 are not disposed directly under the semiconductor die 30. The routing lead 25 can subsequently be routed directly under the semiconductor die 30 to one of the lands 22. The IC package after step 110 is shown in FIG. 2h.

In step 112, the structure in FIG. 2h is encapsulated at the second side of the leadframe 20 with an encapsulation compound 34. The encapsulation compound 34 fills the second recessed portion 27 and covers the plurality of routing leads 25, the plurality of bonding pads 28, the semiconductor die 30 and the bonding wires 32. The second encapsulation compound 34 is in contact with the first bonding compound 21 at areas common to both first recessed portion 24 and second recessed portion 27, as the leadframe material is completely etched away at those areas. The IC package after step 112 is shown in FIG. 2i.

In step 114, the first bonding compound 21 is selectively removed to expose the lands 22 at the first side of the leadframe 20. In a preferred embodiment, the first bonding compound 21 is selectively removed to expose the lands 22 with the remaining first bonding compound 21 being level or coplanar to the lands 22 and filling the first recessed portion 24, i.e. the second portion of the first bonding compound 21 is removed, leaving the first portion attached. Afterwards, solder pads 36 are disposed on each of the lands 22 for attaching to the external device in step 116. The IC package after step 114 and step 116 are shown in FIGS. 2j and 2k respectively.

It is known to one skilled in the art that the above process, and subsequent processes described below, are done at the substrate strip level, and a step of singulation from the substrate strip to produce individual IC packages is performed after step 116. It is also appreciated that other techniques applicable to facilitate the manufacturing process such as aligning the molds to the substrate strip can be used in the embodiments of the present invention.

Figure 3:
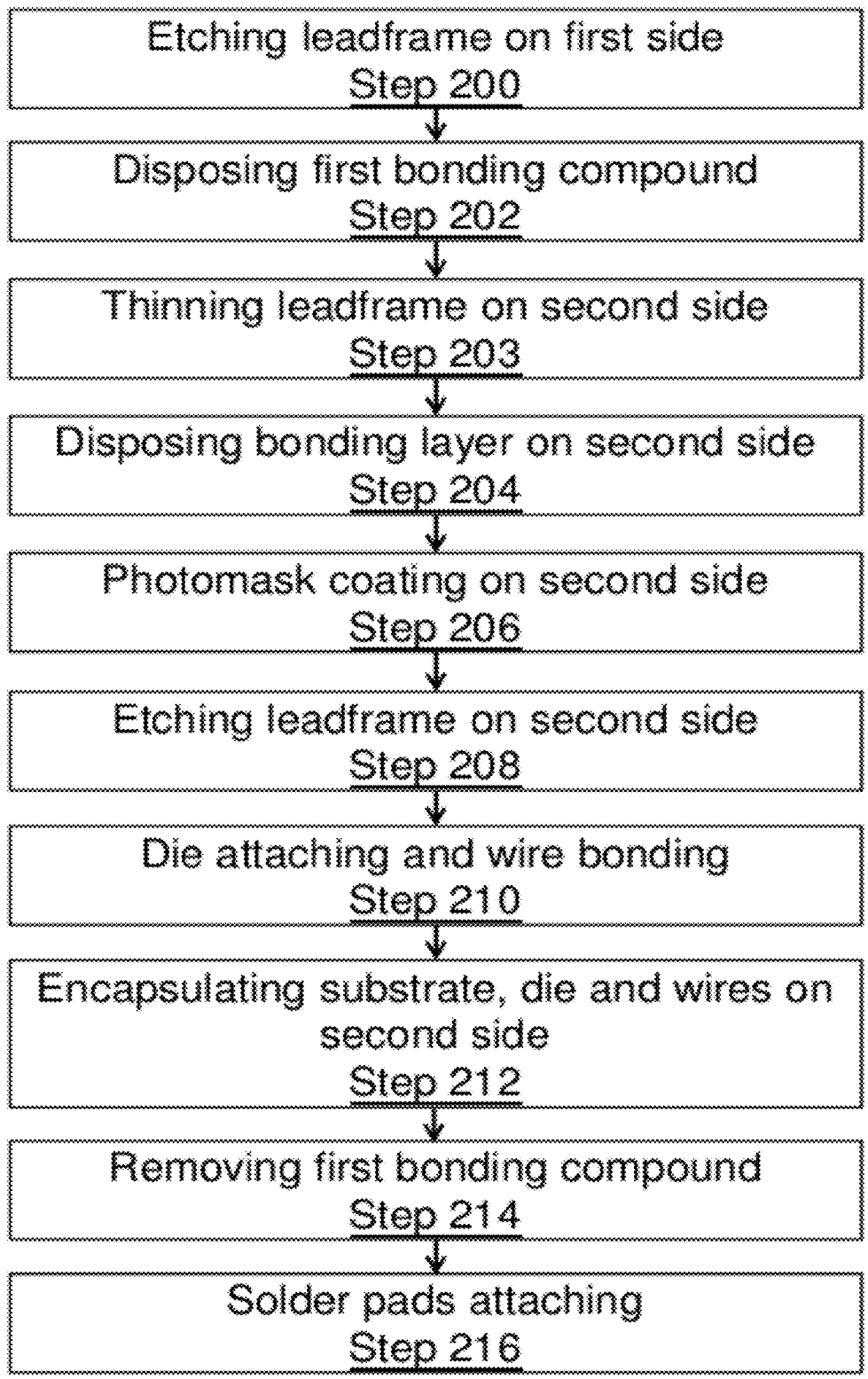
FIG. 3 is a flow chart of a process of manufacturing an integrated circuit chip package according to another embodiment of the present invention.
Figure 4A:
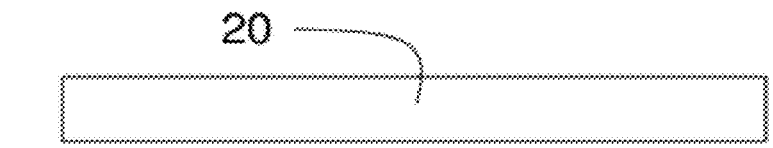
FIG. 4a-4k is a cross-sectional view of an integrated circuit chip package at different steps of the process of FIG. 3.
Figure 4B:
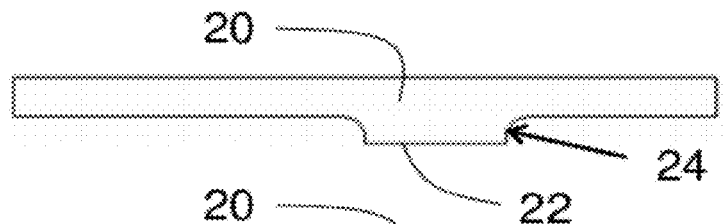
Figure 4C:
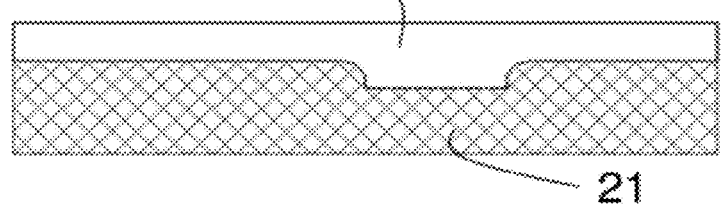
Figure 4D:
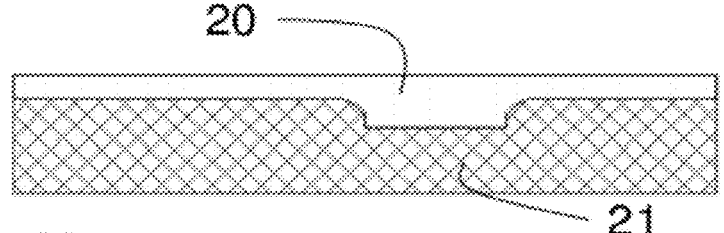
Figure 4E:
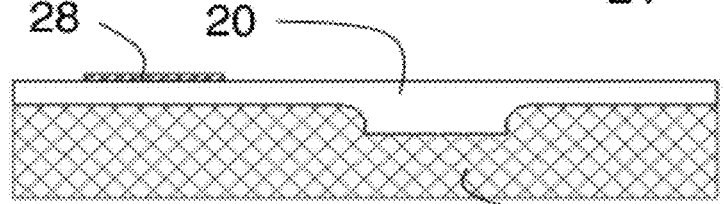
Figure 4F:
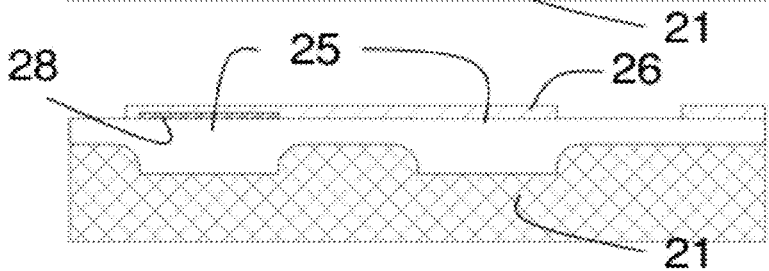
Figure 4G:
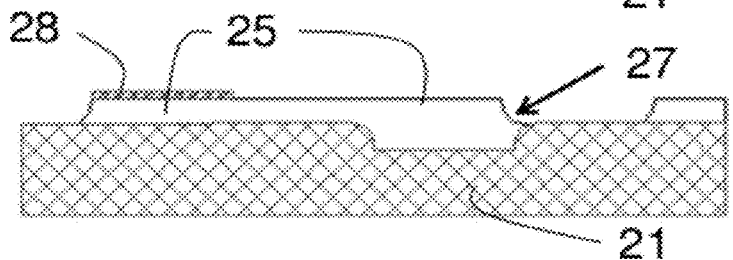
Figure 4H:
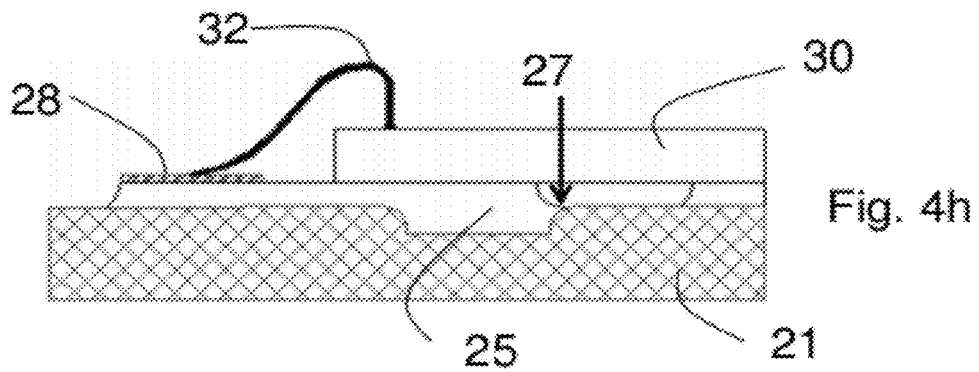
Figure 4I:
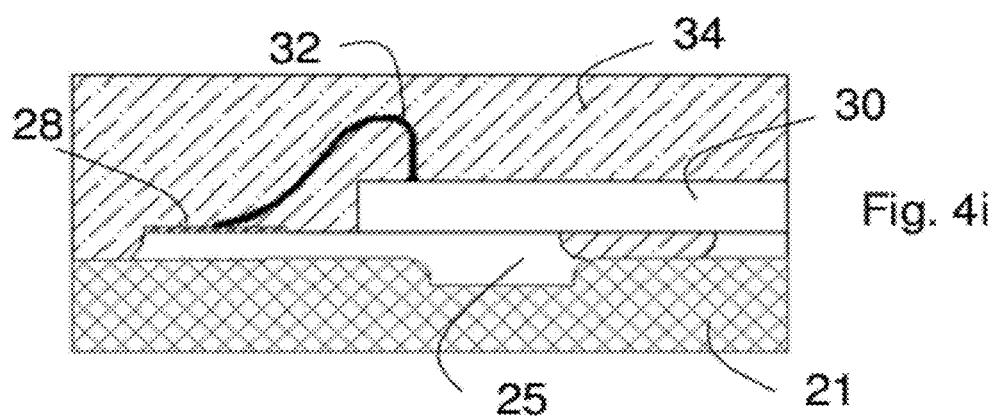
Figure 4J:
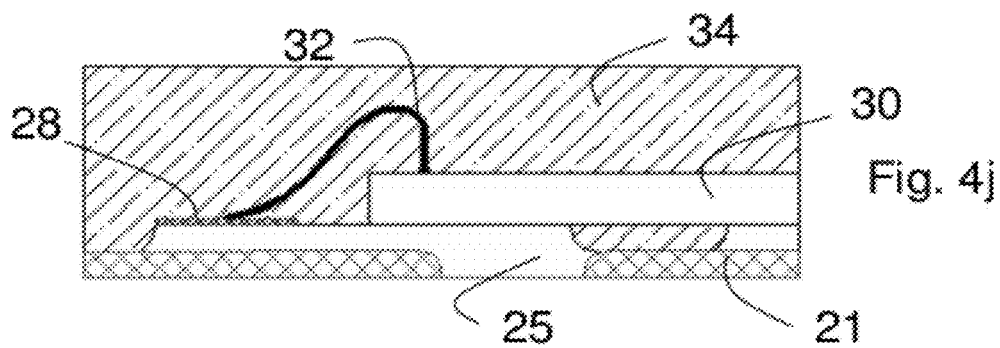
Figure 4K:
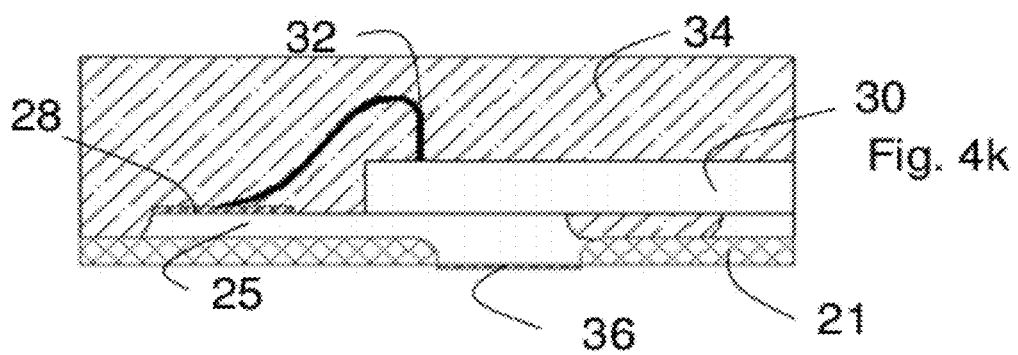
Figure 5:
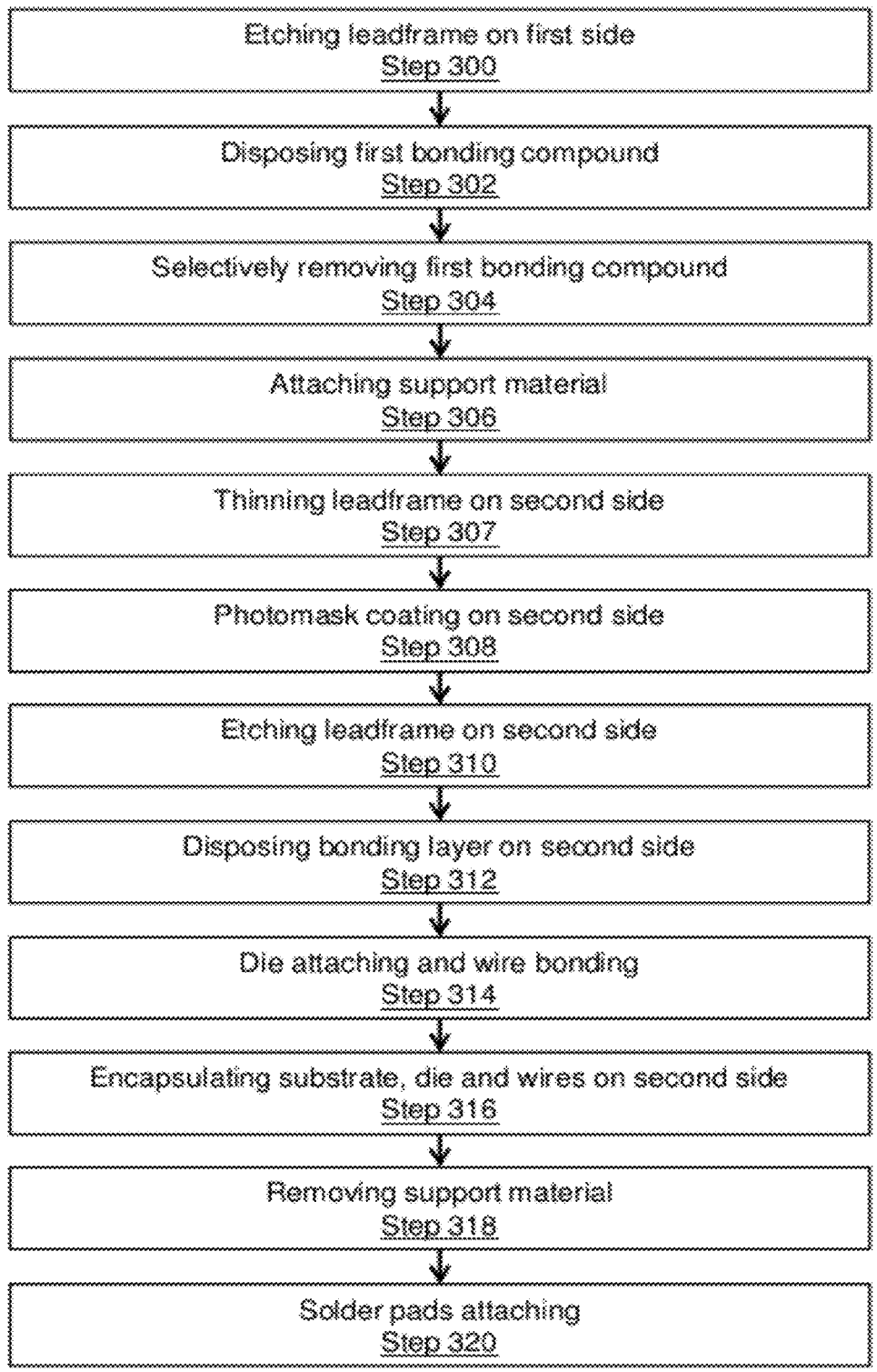
FIG. 5 is a flow chart of a process of manufacturing an integrated circuit chip package according to another embodiment of the present invention.

In a second embodiment of the present invention as shown in FIGS. 3 and 4a-4k, the leadframe 20 is first etched at the first side (step 200), then the first bonding compound 21 is disposed on the first side (step 202), and the optional thinning step is performed (step 203). In this embodiment, the bonding layer is then disposed (step 204) before coating the photomask 26 (step 206) and etching the leadframe on the second side to reveal the routing leads 25 (step 208). That means the bonding layer is first disposed on the leadframe 20 at the second side, then the photomask 26 is disposed on the leadframe 20 at the second side, covering the routing leads 25 as well as the bonding pads 28, as shown in FIG. 4f. The semiconductor die 30 is then attached with wire bonding (step 210), the encapsulation compound 34 is disposed (step 212), the first bonding compound 21 is selectively removed from the first side (step 214), and solder pads 36 are disposed on the lands 22 (step 216). The substrate or IC package at different steps of the process is shown in FIGS. 4a-4k.

As the first encapsulation compound 21 of the pre-bonding step provides the power to hold the leadframe 20 together, when additional first encapsulation compound 21 is disposed to cover the entire leadframe 20, the depth of the first recessed portion 24 can be further reduced. That means a thinner lead frame can be used and as such results in reduced lead frame material usage and also reduced thickness of the final IC package. In a specific embodiment, in a leadframe 20 of 5.0 mil thickness, the depth of the first recessed portion 24 is 2.5 mil. It follows that the second recessed portion 27 also is 2.5 mil thick.

The thickness of the first bonding compound 21 used in the above embodiment is dependent on the thickness of the leadframe 20 and the depth of the first recessed portion. In an exemplary embodiment, where the first recessed portion 24 is 2.5 mil deep, the thickness of the first bonding compound 21 is around 1-5 mil over the first recessed portion 24, such that enough holding strength can be provided to hold the leadframe 20 together.

In another exemplary embodiment where the leadframe 20 is 20 mil thick and the first recessed portion 24 is 10 mil deep, the first bonding compound 21 only fills the first recessed portion 24 and does not extend over the lands 22. In other words, the first bonding compound 21 only comprises the first portion and without the second portion. One of the reasons is that the first bonding compound 21 having a thickness of 10 mil is already able to provide the required strength to hold the leadframe 20 together, therefore additional thickness over the leadframe 20 is not necessary. However, a step to grind and/or polish to the contact areas will be required based on the amount of bonding compound 21 that covers the contacts during this process.

By using bonding wires 32 to electrically connect the semiconductor die 30 to the routing leads 25, the bonding sites of the routing leads 25 does not need to be limited to be directly under the semiconductor die 30. In one exemplary embodiment, a lateral extent of the plurality of bonding pads 28 is larger than the size of the semiconductor die 30. That means a larger area is able to be used for bonding to the semiconductor die 30, without making the routing directly under or near the semiconductor die 30 overcrowded. This is especially effective when many lands 22 are needed for the semiconductor die 30.

In one embodiment, the bonding pads 28 are located as close to the semiconductor die 30 as the technology allows. This minimizes the wire lengths in the IC package and thus optimizes the yield and performance of the IC package while minimizes wire material usage and also the size of the entire IC package. In one embodiment, at least one routing lead 25 runs between two adjacent bonding pads 28 in a routing pattern of routing leads 25.

In an exemplary embodiment, the first encapsulation compound 21 has a coefficient of thermal expansion (CTE) between the CTE of a conventional semiconductor die (around 2.8-3.2) and the CTE of a conventional printed circuit board (around 23). This choice of CTE is essential to the ability of the IC package to operate at high temperatures, as explained below.

Figure 14A:
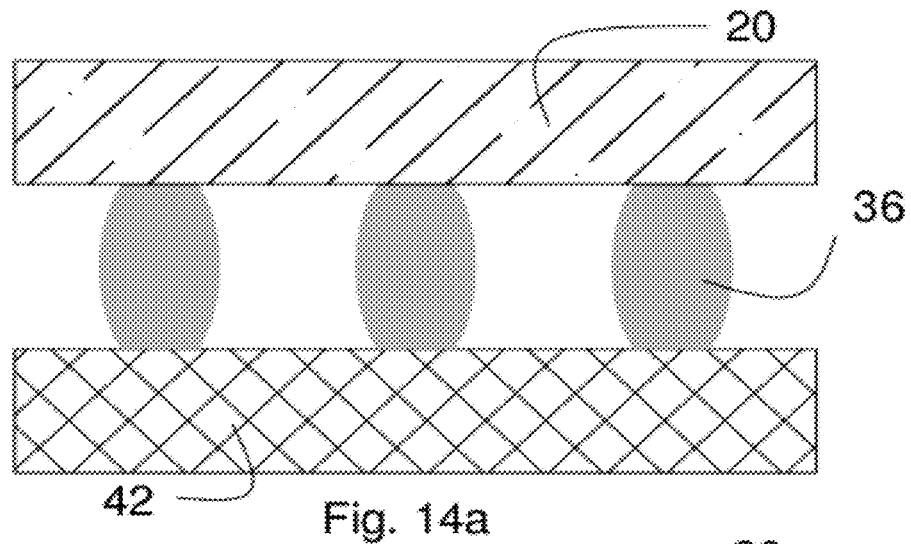
FIG. 14a is a side view of an IC package bonded to a printed circuit board at room temperature.
Figure 14B:
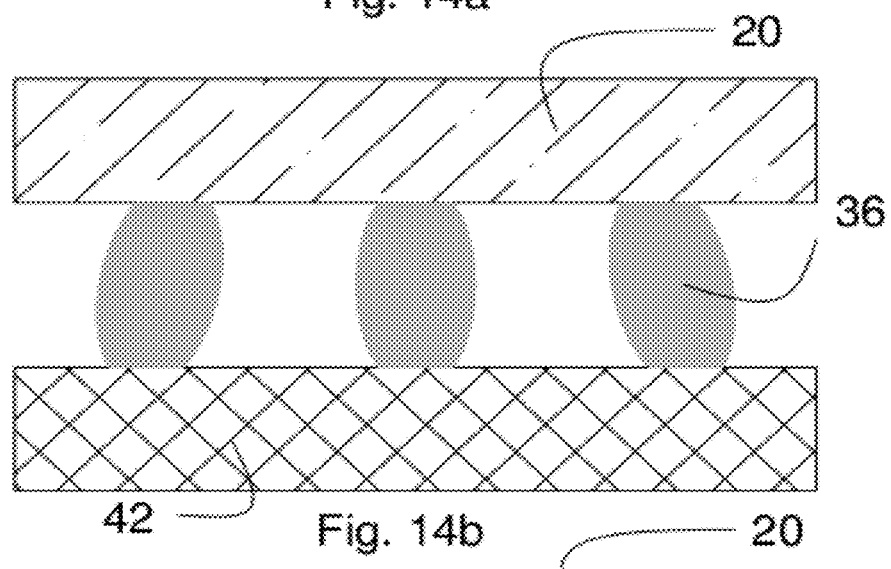
FIG. 14b is a side view of the IC package in FIG. 14a in high temperature where the CTE of the IC package is lower than that of the printed circuit board.
Figure 14C:
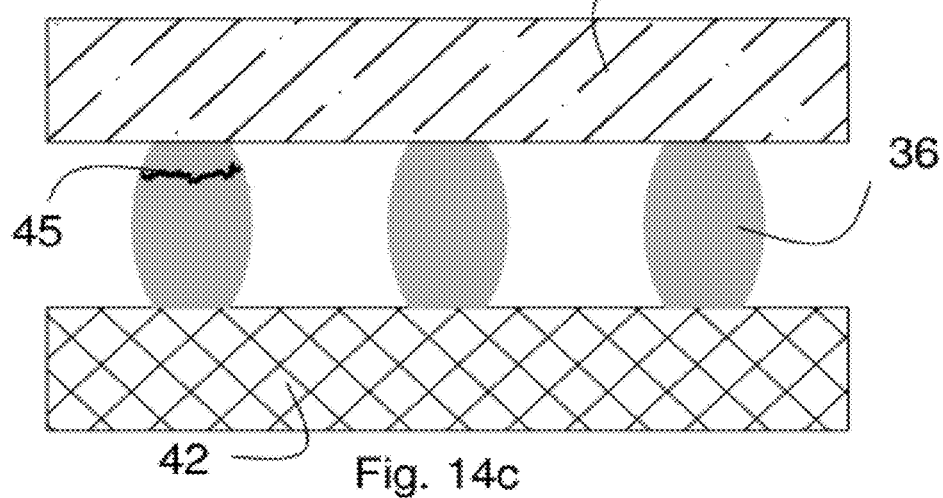
FIG. 14c shows a solder crack between the IC package and the printed circuit board.
Figure 16:
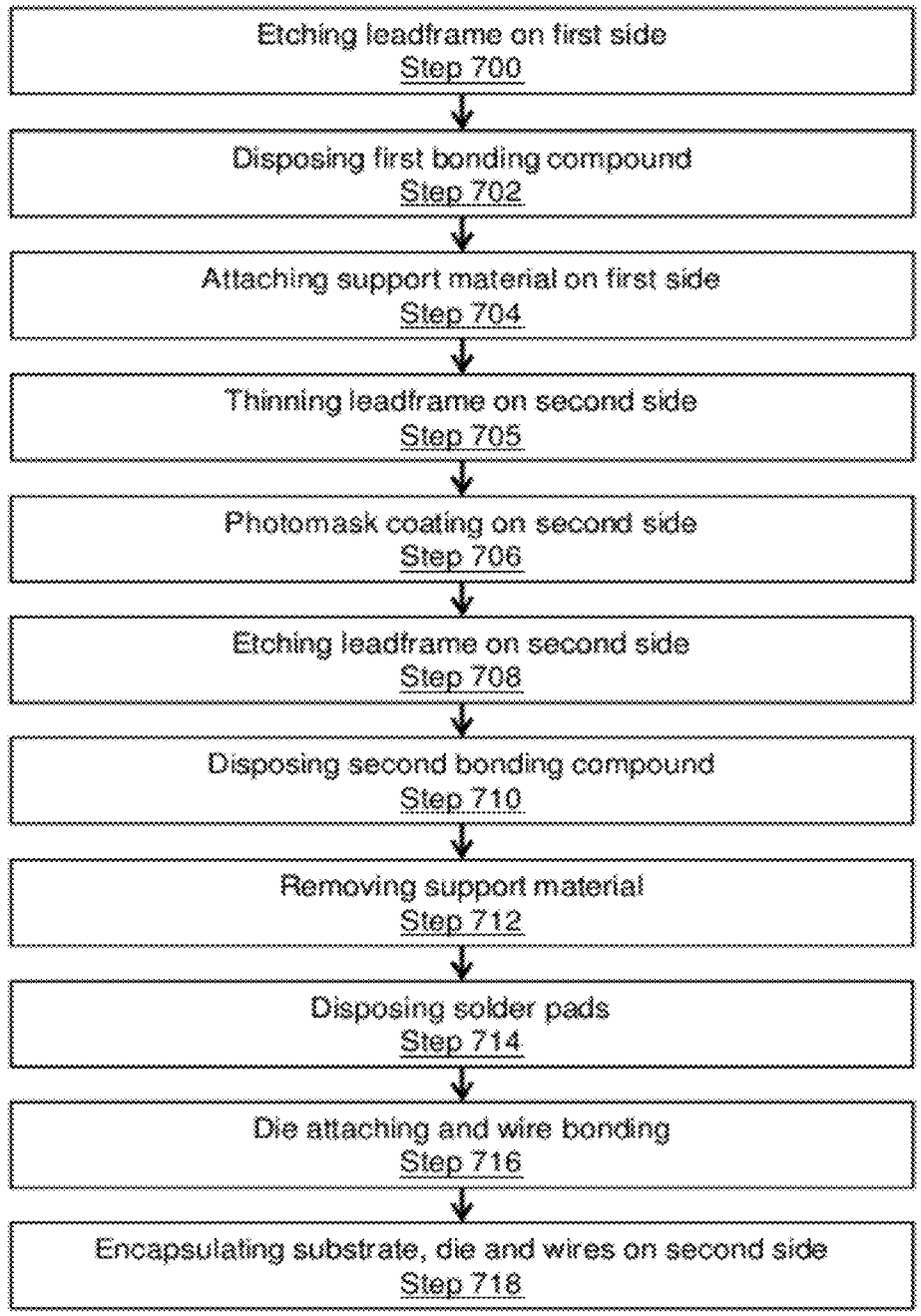
FIG. 16 is a flow chart of a process of manufacturing an integrated circuit chip package according to another embodiment of the present invention.

Referring to FIG. 14a, when the IC package is bonded to the printed circuit board at room temperature, the solder pads 36 of the IC package is aligned to the corresponding ports of the printed circuit board. When the printed circuit board and the IC package are operating at a high temperature, as shown in FIG. 14b, both the printed circuit board and the IC package will expand, but at different rates as mentioned above. As such, the expansion creates a stress force on the solder joints between the IC package and the printed circuit board and at the lands 22 of the IC package. When the stress force is too large, the solder joints will break, making the entire product that uses the IC package unusable. Even the solder joint may be able to withstand such stress force without breaking, after a number of cycles between high temperature and low temperature the solder joint will start to fatigue and may break at the same stress force as time passes by, as illustrated by a solder crack 45 in FIG. 14c. Therefore, the CTE of the first bonding compound 21 needs to be carefully chosen to ensure the stress force is spread around between the first bonding compound 21 and the solder joints for optimal performance.

In one embodiment, the first bonding compound 21 is also an encapsulation compound. In one embodiment, the first bonding compound 21 has a CTE between 7-15. In an exemplary embodiment, the first bonding compound 21 is an engineered plastic material e.g. epoxy or other thermoset or thermoplastic compound having a CTE of around 12 (e.g. 11-13).

In one embodiment, the CTE of the first bonding compound 21 is dependent on the thickness of the leadframe 20. In general, the CTE of the first bonding compound is more towards the high end when the leadframe 20 is thinner and vice versa.

In one embodiment, the selective removing of the first bonding compound 21 (step 114) is performed by a user of the IC package. That means the IC package is transported with the first bonding compound 21 still covering the lands 22. In an exemplary embodiment, the substrate is transported to the user right before the die attachment and wire bonding step.

In an exemplary embodiment, the first bonding compound 21 is conveniently mechanically removable by using a polishing machine for example. A user of the IC package mechanically removes the first bonding compound 21 from the IC package to reveal the lands 22 of the IC package before attaching the solder pads 36 and bonding the IC package to the printed circuit board. To completely remove the second portion of the first bonding compound 21 for attachment of solder pads 36 and subsequent bonding to the printed circuit board, the first bonding compound 21 should be 3 mil or less in thickness at the stage of final polish. If the initial thickness of the bonding compound 21 over the leadframe 20 is more than 3 mil, a portion of the first bonding compound 21 will be first polished using a coarser grit material to reduce the thickness to less than 3 mil for the final polishing step.

In another exemplary embodiment of the present invention as shown in FIGS. 5 and 6a-6m, a support material is used in additional to the first bonding compound 21. The leadframe 20 is still first etched at the first side (step 300, FIG. 6b) to define the lands 22 and the first bonding compound 21 is disposed on the first side of the leadframe (step 302, FIG. 6c). Afterwards, the first bonding compound 21 is then selectively removed to expose the lands 22 (step 304, FIG. 6d), as performed in the previous embodiments after the encapsulation compound is disposed (step 112 or 212). The support material 38 is then attached to the first side of the substrate contacting the lands 22 (step 306, FIG. 6e). In one embodiment, the support material 38 is also adhered to the first bonding compound 21 where the first bonding compound 21 is coplanar to the lands 22.

The subsequent steps of the process from the optional thinning step (step 307) onwards until the encapsulation step at the second side of the substrate (step 316) is the same as the process as shown in FIGS. 2d to 2k, shown in FIGS. 6f-6k. Instead of selectively removing the first bonding compound 21 in the previous embodiments (steps 114, 214), in this embodiment the entire support material 38 is removed, leaving only the first bonding compound 21 with the lands 22 exposed (step 318, FIG. 6l). Solder pads 36 are then disposed on the lands for bonding (step 320, FIG. 6m) to finish the IC package.

The use of the support material 38 in this embodiment makes the process, especially the step of selectively removing the first bonding compound 21 easier. This is due to the fact that the IC package before the aforementioned step only has the leadframe 20 and the first bonding compound 21, which is much simpler than that in the previous embodiments with the semiconductor die 30. Depending on the removing process, the semiconductor die 30 or other components such as the encapsulation compound 34 may be damaged during the removing process, thus reducing yield of the product. The support material 38 is attached after selectively removing the first bonding compound 21 to provide the additional strength needed to support the substrate for subsequent manufacturing steps, which is previously provided by the removed portion of the first bonding compound 21.

Using the support material 38 also lowers the requirement for choosing the appropriate material as the first bonding compound 21. The first bonding compound 21 should have a CTE within a specific range, with sufficient strength to hold the leadframe 20 together and also being easy to remove by processes such as mechanical polishing. When the support material 38 is also used, each of these characteristics only needs to be found in one of the materials. In an exemplary embodiment, the first bonding compound 21 is selected for having an appropriate CTE, and the support material 38 is selected for strength and ease of removal. In a specific embodiment, the support material 38 is a high temperature tape currently used in QFN packages. This has an added advantage of the user not needing a separate polishing machine, as users are likely to have such tape removal process ready and operating, thus making the process more convenient for the user.

In an alternative embodiment, the support material 38 is the only material holding the leadframe 20 together, which means that the first bonding compound 21 is absent. The support material 38 would then be only adhered to the lands 22, with the first recessed portion 24 unfilled. Apart from holding the leadframe 20 together, the support material 38 also covers the lands 22 to prevent mold flash during encapsulation of the IC package.

In various embodiments, the steps of selectively removing the first bonding compound 21 and attaching the support material 38 can be done at any time between disposing the first bonding compound 21 and attaching the semiconductor die 30. Preferably, the support material 38 is attached right after selectively removing the first bonding compound 21 to minimize the chance of breaking of the substrate. In another embodiment, the initial disposal of the first bonding compound 21 only fills the first recessed portion 24 and does not extend over the leadframe 20, thus the selective removal is not needed and the support material 38 can be directly attached thereto.

Figure 8A:
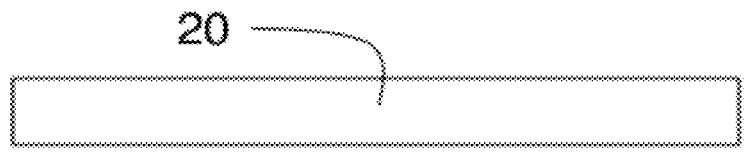
FIG. 8a-8m is a cross-sectional view of an integrated circuit chip package at different steps of the process of FIG. 7.
Figure 8B:
Figure 8C:
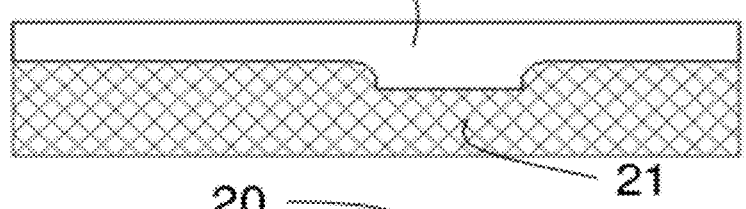
Figure 8D:
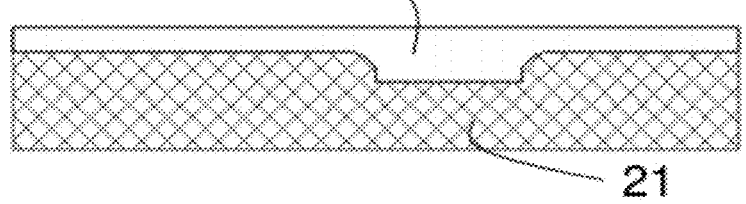
Figure 8E:
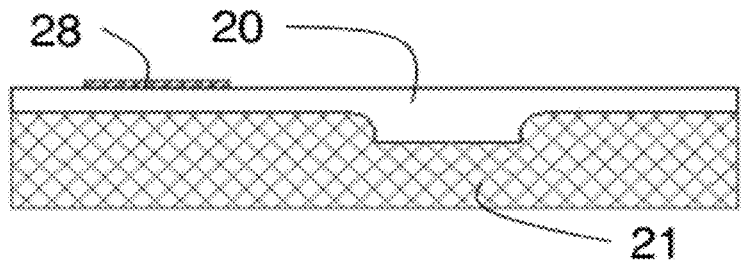
Figure 8F:
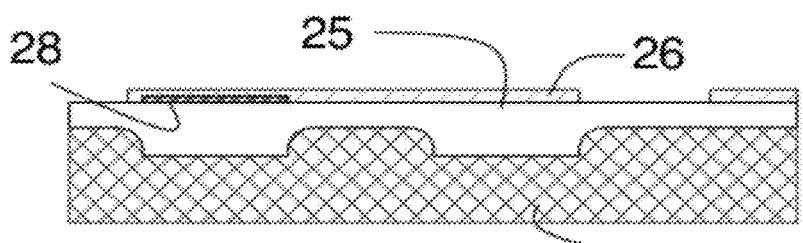
Figure 8G:
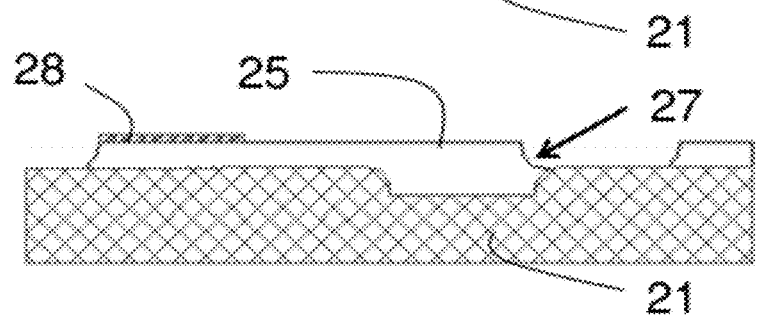
Figure 8H:
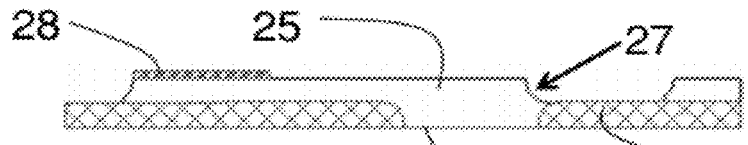
Figure 8I:
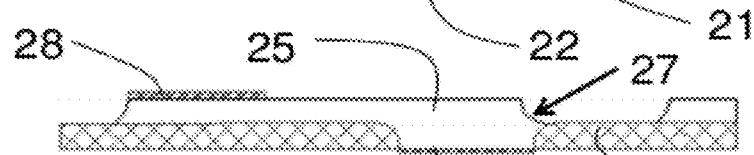
Figure 8J:
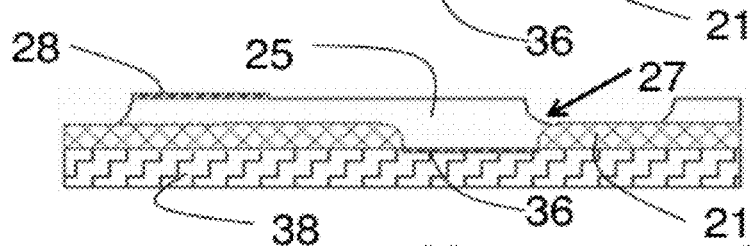
Figure 8K:
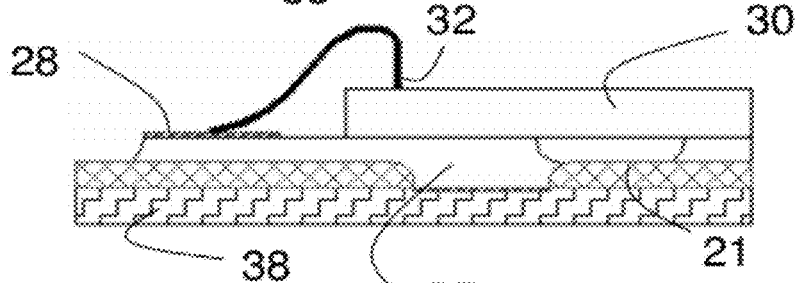

In another embodiment of the present invention as shown in FIGS. 7 and 8a-8k, the steps are the same as the embodiment as shown in FIG. 3 until the routing leads 25 are defined, i.e. steps 400-408 are the same as steps 200-208 (shown in FIGS. 8a-8g). In this embodiment however, after etching the leadframe on the second side, the first bonding compound 21 is selectively removed (step 410, FIG. 8h), similar to step 318 of the above embodiment. Also, in this embodiment, solder pads 36 are disposed onto the lands 22 (step 412, FIG. 8i) before attaching the support material 38 to the first side of the substrate (step 414, FIG. 8j). The IC package is then finished with die attaching with wire bonding, disposing the encapsulation compound 34 and removing the support material 38 (steps 416-420, FIG. 8k-8m).

Having the solder pads 36 disposed on the lands 22 before attaching the second support material 38 further makes the IC package more convenient to use, as the user can now simply remove the support material 38 and the IC package is ready for bonding to the printed circuit board. That means the user does not need to dispose solder pads 36 on his end.

Figure 10A:
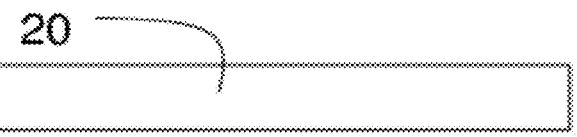
FIG. 10a-10l is a cross-sectional view of an integrated circuit chip package at different steps of the process of FIG. 9.
Figure 10B:
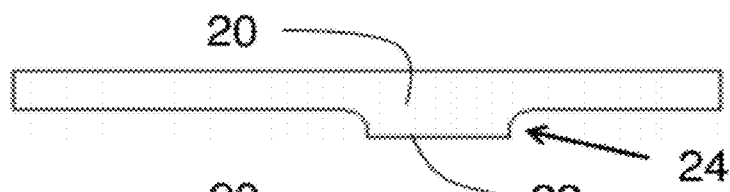
Figure 10C:
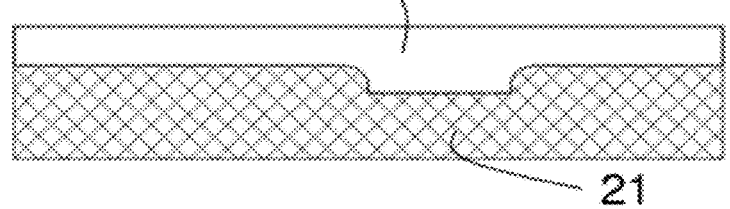
Figure 10D:
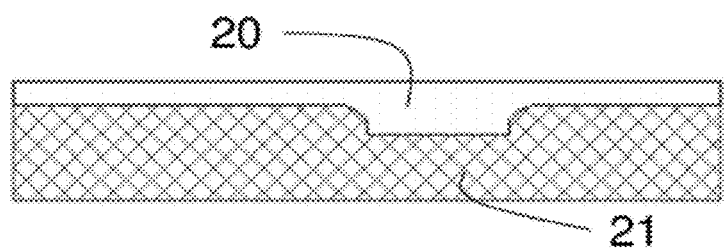
Figure 10E:
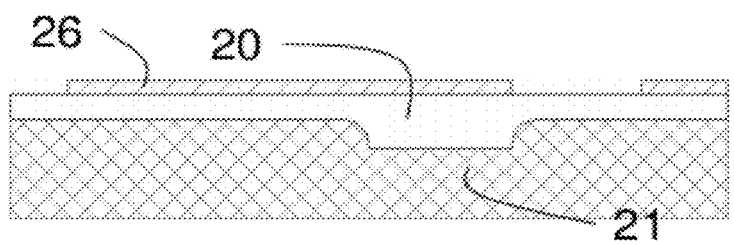
Figure 10F:
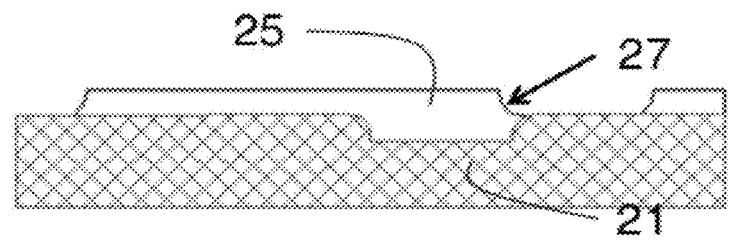
Figure 10G:
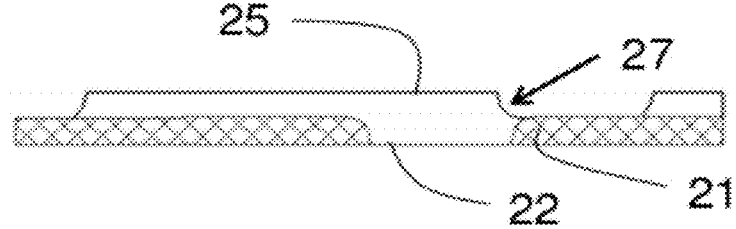
Figure 10H:
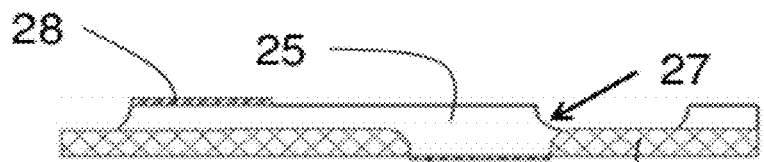
Figure 10I:
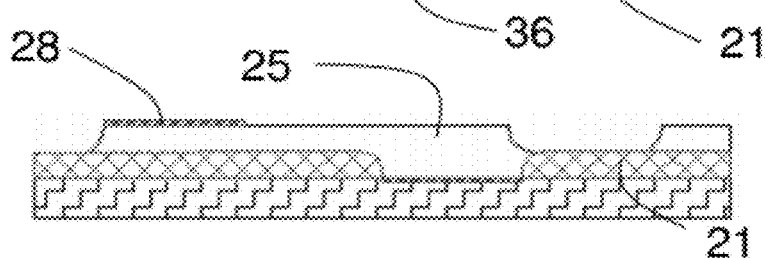
Figure 10J:
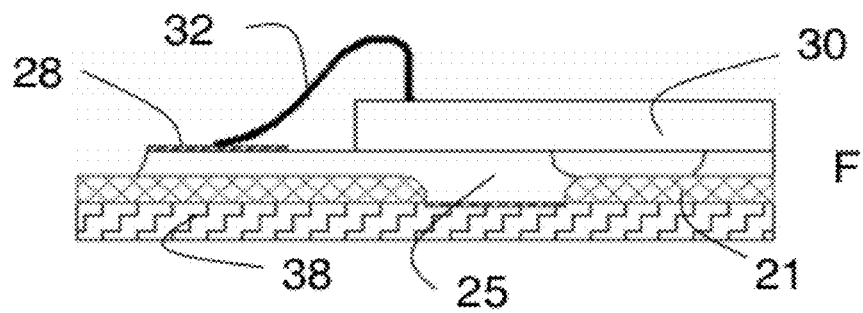
Figure 10K:
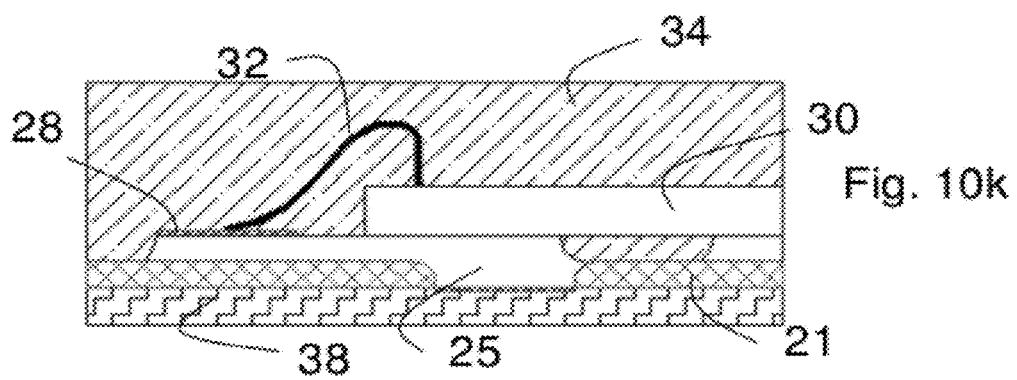
Figure 10L:
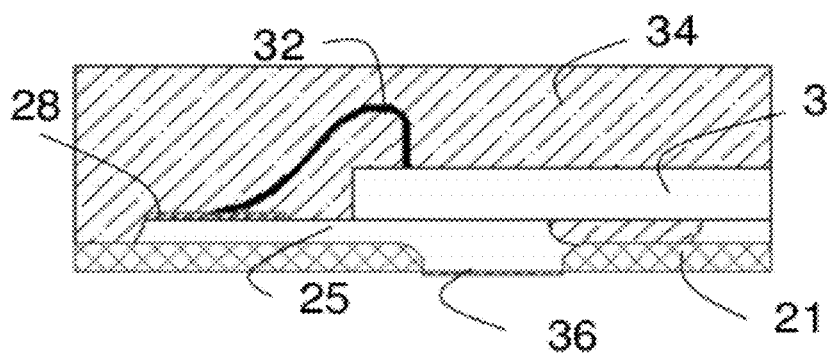
Figure 11:
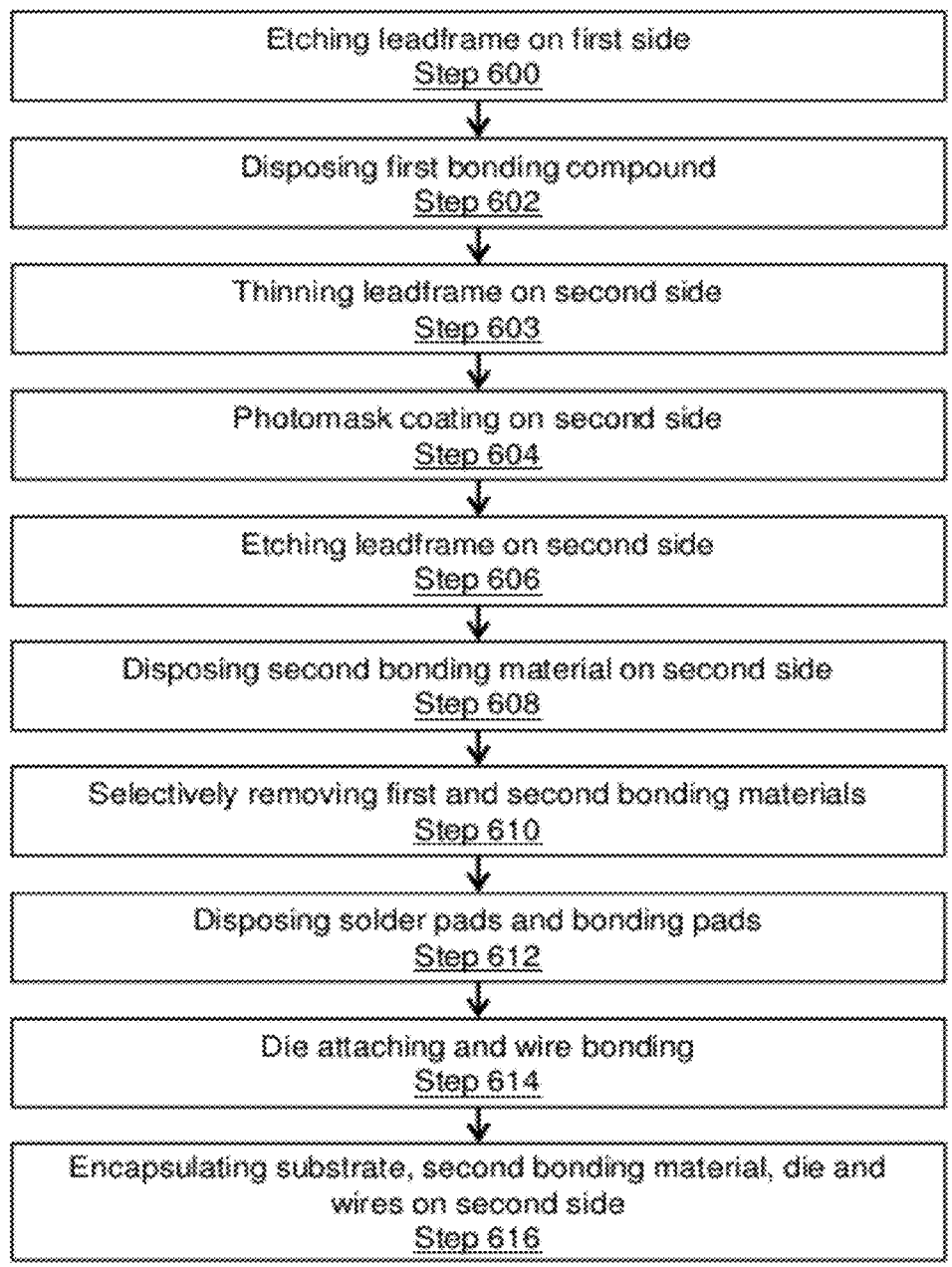
FIG. 11 is a flow chart of a process of manufacturing an integrated circuit chip package according to another embodiment of the present invention.

In another embodiment as shown in FIGS. 9 and 10a-10k, the leadframe 20 is first etched on the first side (step 500, FIG. 10b), then the first bonding compound 21 is disposed (step 502, FIG. 10c) and the optional thinning is performed (step 503, FIG. 10d). Afterwards, the photomask 26 is coated on the second side of the substrate (step 504, FIG. 10e). After coating the photomask, the substrate is etched at the second side to define routing leads 25 (step 506, FIG. 10f, and then the first bonding compound 21 is selectively removed to expose the lands 22 (step 508, FIG. 10g). As shown in FIG. 10g, at this stage the lands 22 and the routing leads 25 are both exposed. Afterwards, the deposition of bonding pads 28 and the solder pads 36 at the routing leads 25 and the lands 22 respectively is performed in a single step (step 510, FIG. 10h). The support material 38 is then disposed (step 512, FIG. 10i) for subsequent die attaching (step 514, FIG. 10j) and encapsulating on second side (step 516, FIG. 10k). The support material 38 is then removed to finish the IC package (step 518, FIG. 10l).

By using a single step to deposit the bonding layer 28 and the solder pads 36, the total number of steps in manufacturing can be reduced, thus simplifying and optimizing the process.

In yet another exemplary embodiment as shown in FIGS. 11 and 12a-12j, first the routing leads 25 are defined in a way identical to steps 500-506 in the above embodiment (steps 600-606, FIGS. 12b-12f). Afterwards, a second bonding compound 40 is disposed on the second side of the substrate (step 608, FIG. 12g), covering the routing leads 25 and the second recessed portion 27, and also contacting the first bonding compound 21 from the second recessed portion 27. In one embodiment, the second bonding compound 40 extends over the second side of the—substrate by a predetermined distance, similar to the way the first bonding compound 21 extending over the first side of the leadframe 20. Afterwards, the first bonding compound 21 and the second bonding compound 40 are both selectively removed to be coplanar to the lands 22 and the routing leads 25 respectively (step 610, FIG. 12h). Bonding pads 28 and solder pads 36 are then simultaneously deposited on the routing leads 25 and the lands 22 respectively (step 612, FIG. 12i). The semiconductor die 30 is then attached to the second side of the—substrate 20 with bonding wires 32 (step 614, FIG. 12j), and the encapsulation compound 34 is then disposed to cover the semiconductor die 30, the bonding wires 32, the bonding pads 28 and also second bonding compound 40 to finish the IC package (step 616, FIG. 12k).

This embodiment uses the second bonding compound 40 to fill the second recessed portion 27 in addition to using the first bonding compound 21 to fill the first recessed portion 24 for holding the leadframe 20 together. Therefore this second bonding compound 40 provides extra holding strength to the substrate during the subsequent steps to finish the substrate and IC package (steps 610 to 616, FIGS. 12i through 12k), thus further reducing the chance of the routing leads 25 being displaced during these steps.

In one embodiment, the support material 38 as shown in FIG. 6 is also attached to the substrate, especially useful in the case where the leadframe 20 is very thin.

In one embodiment, the first bonding compound 21 is the same as the second bonding compound 40. In another embodiment, the second bonding compound 40 is chosen to be different. One reason would be the need for a different CTE requirement than the first bonding compound 21, such as between the CTE of the semiconductor die 30 and the first bonding compound 21, due to that the second bonding compound 40 is closer to the semiconductor die 30.

In one embodiment, instead of using a die attach pad for electrically insulating the routing leads 25 from the semiconductor die 30, a non-conductive die attach material is selectively disposed onto a predetermined area of the second side of the substrate 20. In an exemplary embodiment, the predetermined area is the area where the semiconductor die will be attached to the substrate. In one embodiment, the die attach material is disposed onto the routing leads 25 within the predetermined area. As such, the area having the die attach material is similar to the area of the semiconductor die 30.

In an exemplary embodiment as shown in FIG. 15a, the die attach material 42 is disposed onto a predetermined area of the substrate, covering the second recessed portion 27 within this predetermined area, and also covers the routing leads 25 within this predetermined area by a thickness enough for insulating purposes. In another embodiment as shown in FIG. 15b, the material filling the second recessed portion 27 and the material disposed on the routing leads 25 are different. For example, a first die attach material 42 disposed on the routing leads 25 is more thermo-conductive than a second die attach material 44 filling the second recessed portion 27, to improve heat dissipation performance of the semiconductor die 30.

This disposal of the die attach material in the second recessed portion 27 improves the quality of encapsulation of the IC package. In the previous embodiment, a plurality of tunnels defined by the semiconductor die 30 and the second recessed portion 27 will be formed after the semiconductor die 30 is attached onto the leadframe 20 at the predetermined area. Depending on the technology and the encapsulation compound 34 used, these tunnels may not be able to be completely filled with the encapsulation compound 34 during the encapsulation step. That means that air bubbles will be formed within the IC package, and it will greatly hamper the performance of the IC package such as the die delaminating from the surface or poorer transmission of heat out of the package. Disposing the die attach material to fill the second recessed portion 27 before attaching the semiconductor die 30 eliminates such problem.

The step of disposing the non-conductive die attach material can be performed at any time after the substrate is patterned on the second side and before the semiconductor die 30 is attached. In the embodiment shown in FIGS. 1,3,5,7 and 9 the die attach material can be disposed any time after the etching on the second side.

In one embodiment, the non-conductive die attach material is a standard die attach material used in the industry. In an exemplary embodiment, the CTE of the die attach material is designed to be close to that of the semiconductor die 30 as the die attach material is directly beneath the semiconductor die 30. It is especially advantageous in the case where the die attach material is disposed in the second recessed portion 27 also as the area and thickness of the die attach material both increase.

Figure 17H:
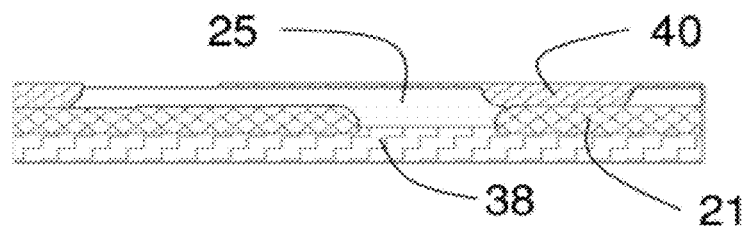

In yet another exemplary embodiment as shown in FIGS. 16 and 17a-h, the leadframe 20 is first etched on the first side (step 700, FIG. 17b), and the first bonding compound 21 is disposed on the first side of the leadframe 20 (step 702, FIG. 17c). In a specific embodiment, the first bonding compound 21 is a photolithographic solder mask. The solder mask is then exposed at selected portions to reveal the lands 22 on the first side of the leadframe 20. In a specific embodiment, the thickness of the solder mask is less than the depth of the first recessed portion 24, so the leadframe 20 does not need to be polished to make the solder mask coplanar with the lands 22. In another embodiment, the first bonding compound 21 is an epoxy material.

An optional support material 38 is then attached to the leadframe 20 at the first side, contacting the first bonding compound 21 and the lands 22 (step 704, FIG. 17d). The leadframe 20 is then optionally thinned at the second side (step 705, FIG. 17e). The photomask 26 is then disposed on the second side of the leadframe 20 (step 706, FIG. 17f. The leadframe 20 is etched on the second side subsequently and the photomask 26 is then removed (step 708, FIG. 17g).

Figure 17I:
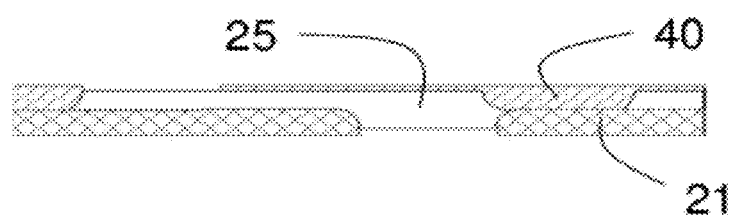
Figure 17J:
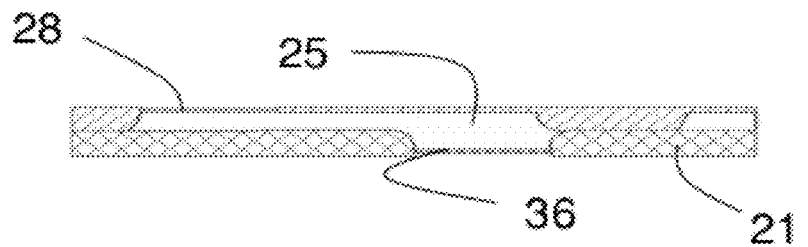
Figure 17K:
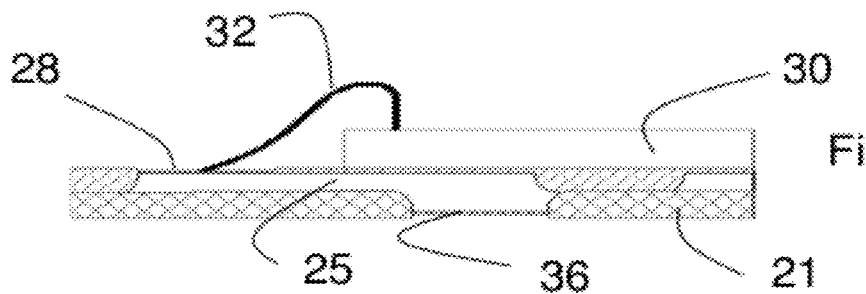
Figure 17L:
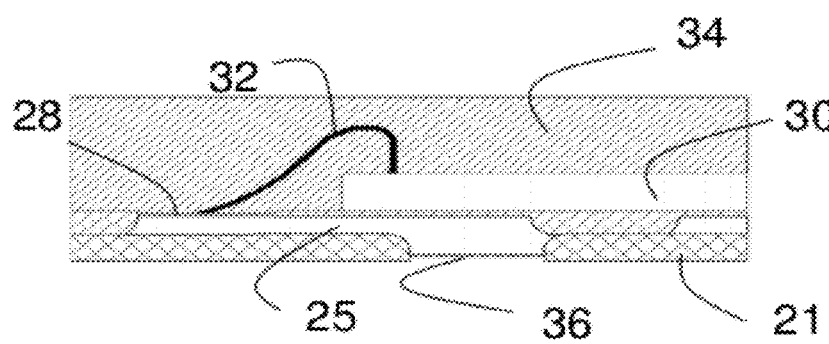

Afterwards, the second bonding compound 40 is disposed on the second side of the leadframe 20 (step 710, FIG. 17h). In an exemplary embodiment, the second bonding compound 40 is a photolithographic solder mask. The solder mask is then exposed at selected portions to reveal the bonding pads 28 on the second side of the leadframe 20. The support material 38 is then removed from the leadframe 20 (step 712, FIG. 17i), the solder pads 36 and bonding pads 28 are disposed attached to the lands 22 (step 714, FIG. 17j), the semiconductor die 30 and the bonding wires 32 are attached (step 716, FIG. 17k), and the encapsulation compound 34 is then disposed to cover the semiconductor die 30, the bonding wires 32, the bonding pads 28 and also the second bonding compound 40 to finish the IC package (step 718, FIG. 17l).

Figure 18A:
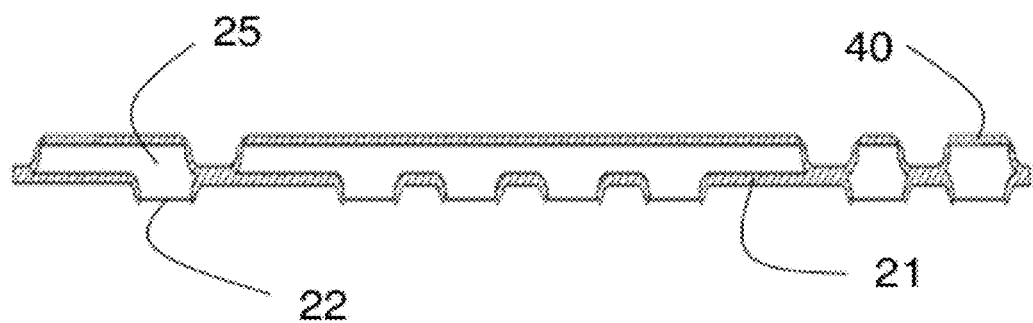
FIG. 18a is a cross-sectional view of a substrate using a photolithographic solder mask as both the first bonding compound and the second bonding compound, according to an embodiment of the present invention.

Using a photolithographic solder mask as the first bonding compound 21 and/or the second bonding compound 40 allows the manufacturer to selectively expose a portion of the leadframe 20 while still covering the other parts of the leadframe 20. For example, in the embodiment as shown above, only the bonding sites of the routing leads 25 are exposed while the rest of the routing leads 25 are still covered by the solder mask. In one embodiment, where the first bonding compound 21 is the solder mask, the solder mask can be thinner than the depth of the first recessed portion 24, and the lands 22 have a clearance to the surface of the solder mask. A cross-section diagram of an example substrate using a solder mask as both the first bonding compound 21 and the second bonding compound 40 is shown on FIG. 18a.

Figure 18B:
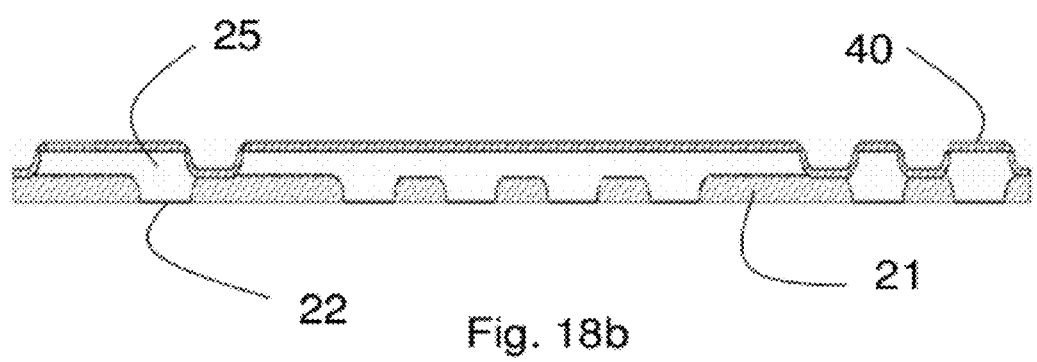
FIG. 18b is a cross-sectional view of a substrate using a photolithographic solder mask as the first bonding compound and an epoxy material as the second bonding compound, according to an embodiment of the present invention.

On the other hand, while an epoxy material is generally stronger, a grinding process is needed to remove the epoxy material from the substrate. The result is that the epoxy material must be coplanar to the exposed portions of the leadframe 20, whether it is the lands 22 or the routing leads 25. A cross-section diagram of an example substrate using an epoxy material as the first bonding compound 21 and a solder mask as the second bonding compound 40 is shown on FIG. 18b. One of the benefits of using epoxy is that the extra strength provided by the epoxy means that the optional support material 38 is generally not required.

Figure 19A:
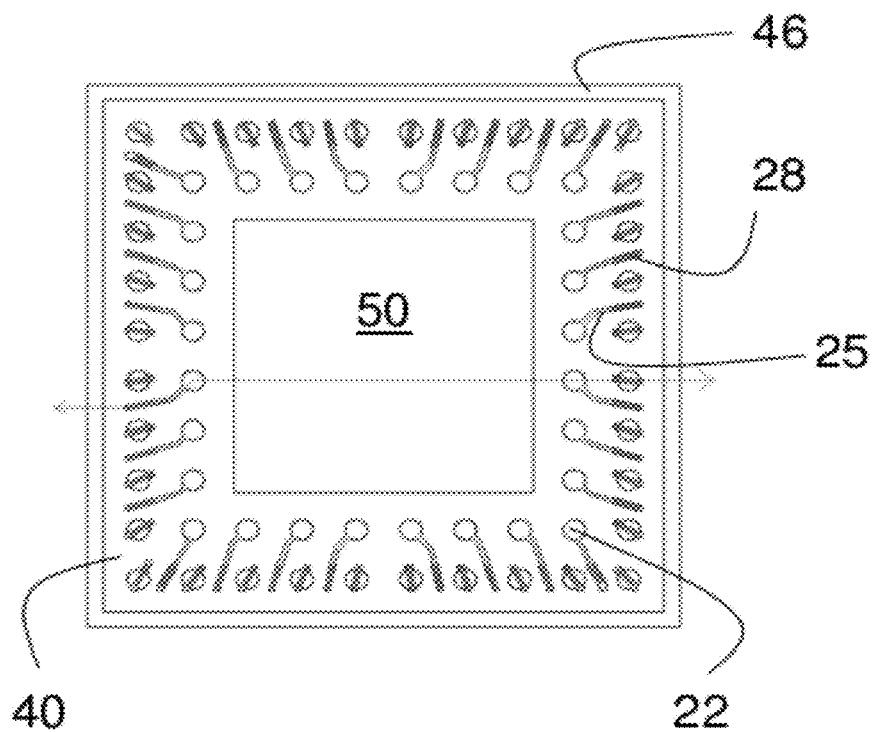
FIG. 19a is a top view of a substrate showing a support ring provided surrounding the substrate, according to an embodiment of the present invention.
Figure 19B:
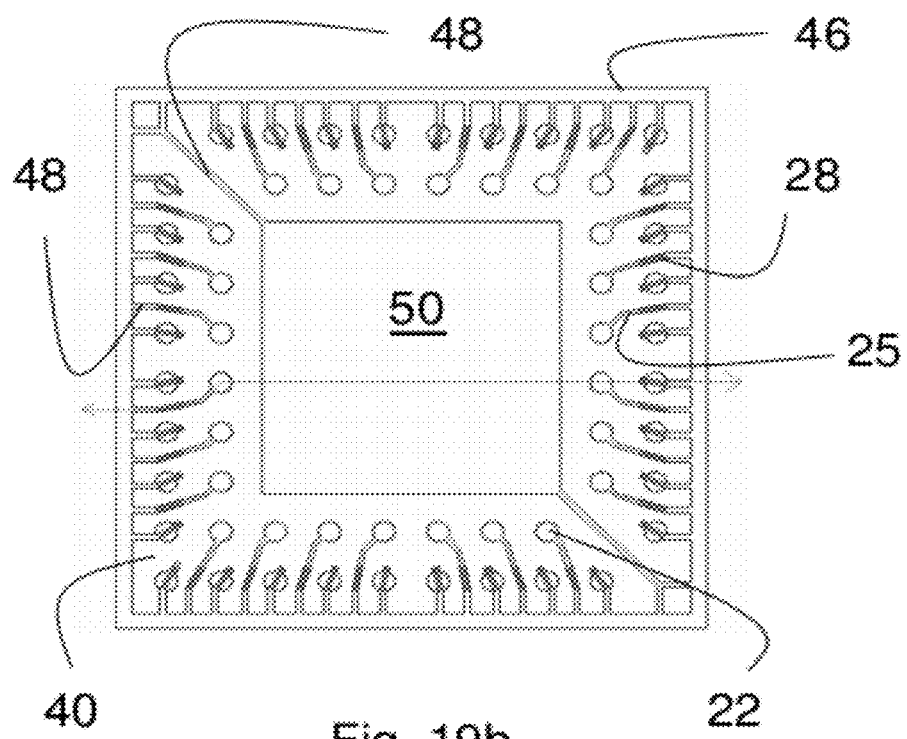
FIG. 19b is a top view of the substrate in FIG. 19a, with a tie bar connecting each routing lead and the die attach pad to the support ring.

In an exemplary embodiment, extra leadframe material is provided to further strengthen the substrate during the manufacturing process. Referring to FIG. 19a, a support ring 46 is provided surrounding each individual unit of the leadframe 20, i.e. routing leads 25, lands 22 or die attach pad. The first bonding compound 21 and the second bonding material 40 both extends to the support ring 46 during the manufacturing process, such that the periphery of the substrate is less likely to displace or break. In another embodiment, tie bars 48 are attached from the support ring 46 to at least one routing lead 25 and may also be attached to the die attach pad 50. Having tie bars 48 further minimizes the chance that a particular structure becomes loose. Also, standard electroplating techniques can be applied to the substrate as each routing lead 25 is now electrically connected during the manufacturing process. The support ring 46 is removed during singulation, therefore the routing leads 25 are still electrically isolated when in use.

Referring now to FIG. 2i, an IC package manufactured by the process in FIG. 1 comprises an electrically conductive lead frame leadframe 20. The leadframe 20 comprises a plurality of lands 22 on a first side of the leadframe with a first recessed portion 24 between lands 22 and a plurality of routing leads 25 on a second side of the leadframe with a second recessed portion 27 between the routing leads 25. Each land 22 is electrically connected to a corresponding routing lead 25. A bonding pad 28 is disposed on a bonding site of each routing lead.

The IC package also comprises a first bonding compound 21. The first bonding compound 21 comprises a first portion that fills the first recessed portion 24 and a second portion that covers the plurality of lands 22 and the first portion. The IC package comprises a semiconductor die 30 with bonding wires 32 electrically connecting the semiconductor die 30 to the bonding pads 28, and an encapsulation compound 34 filling the second recessed portion 27, and also covering the plurality of routing leads 25, the plurality of bonding pads 28, the semiconductor die 30 and the bonding wires 32. The first bonding compound 21 contacts with the encapsulation compound 34 at areas common to the first recessed portion 24 and the second recessed portion 27.

Figure 6I:
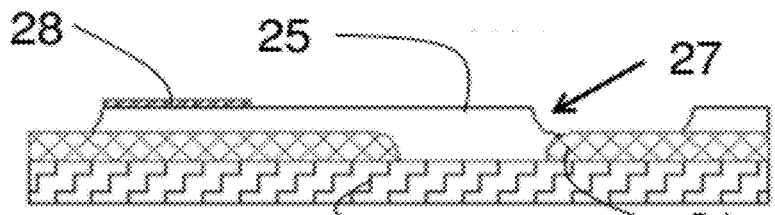
Figure 6J:
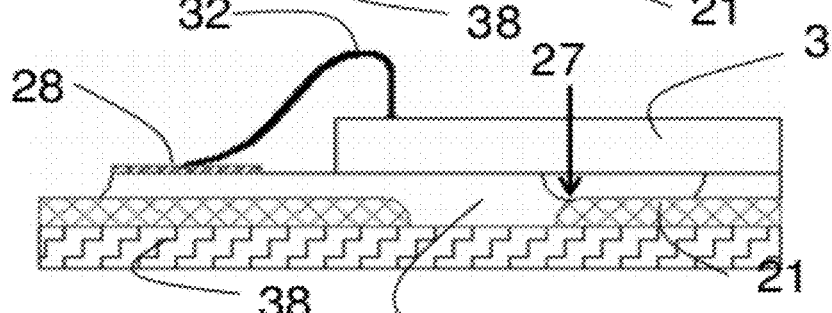
Figure 6K:
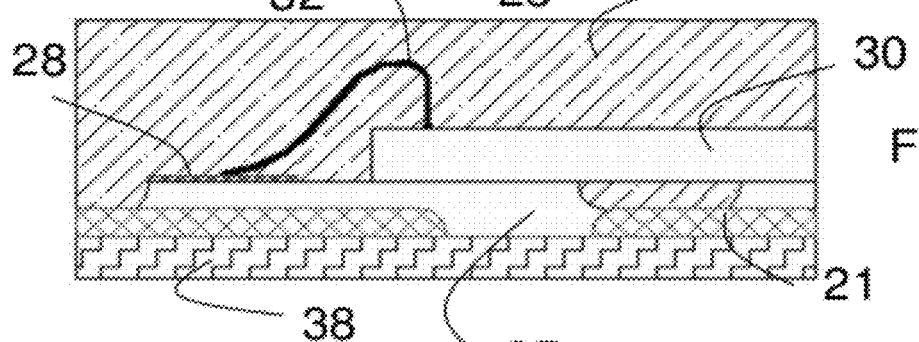
Figure 6L:
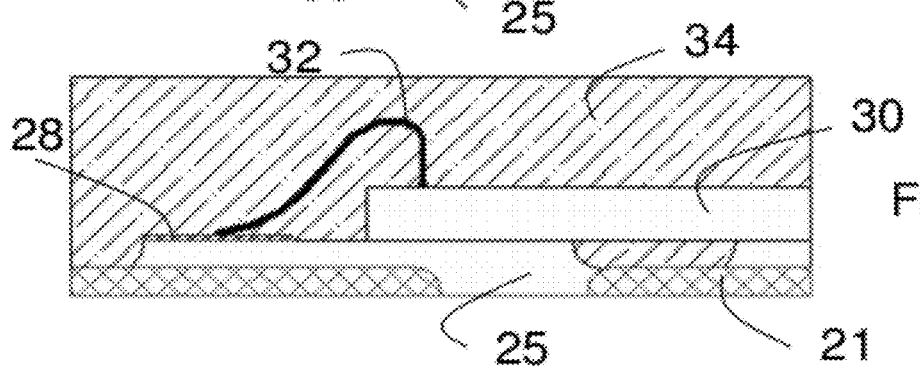
Figure 6M:
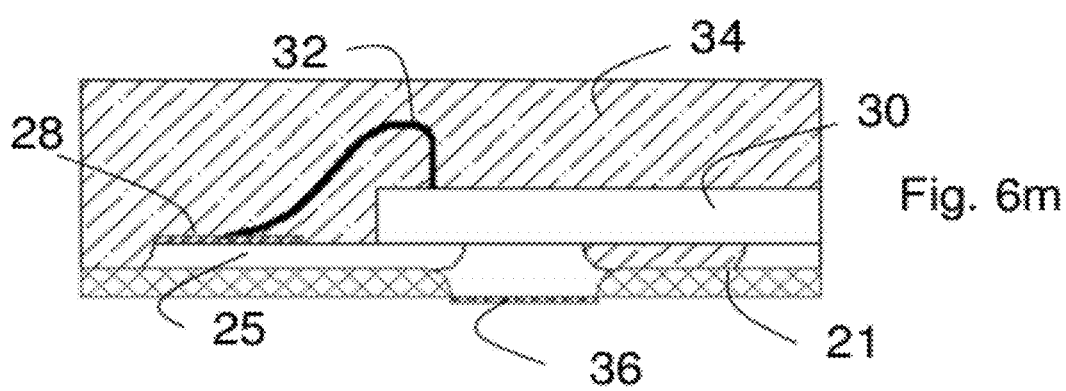
Figure 7:
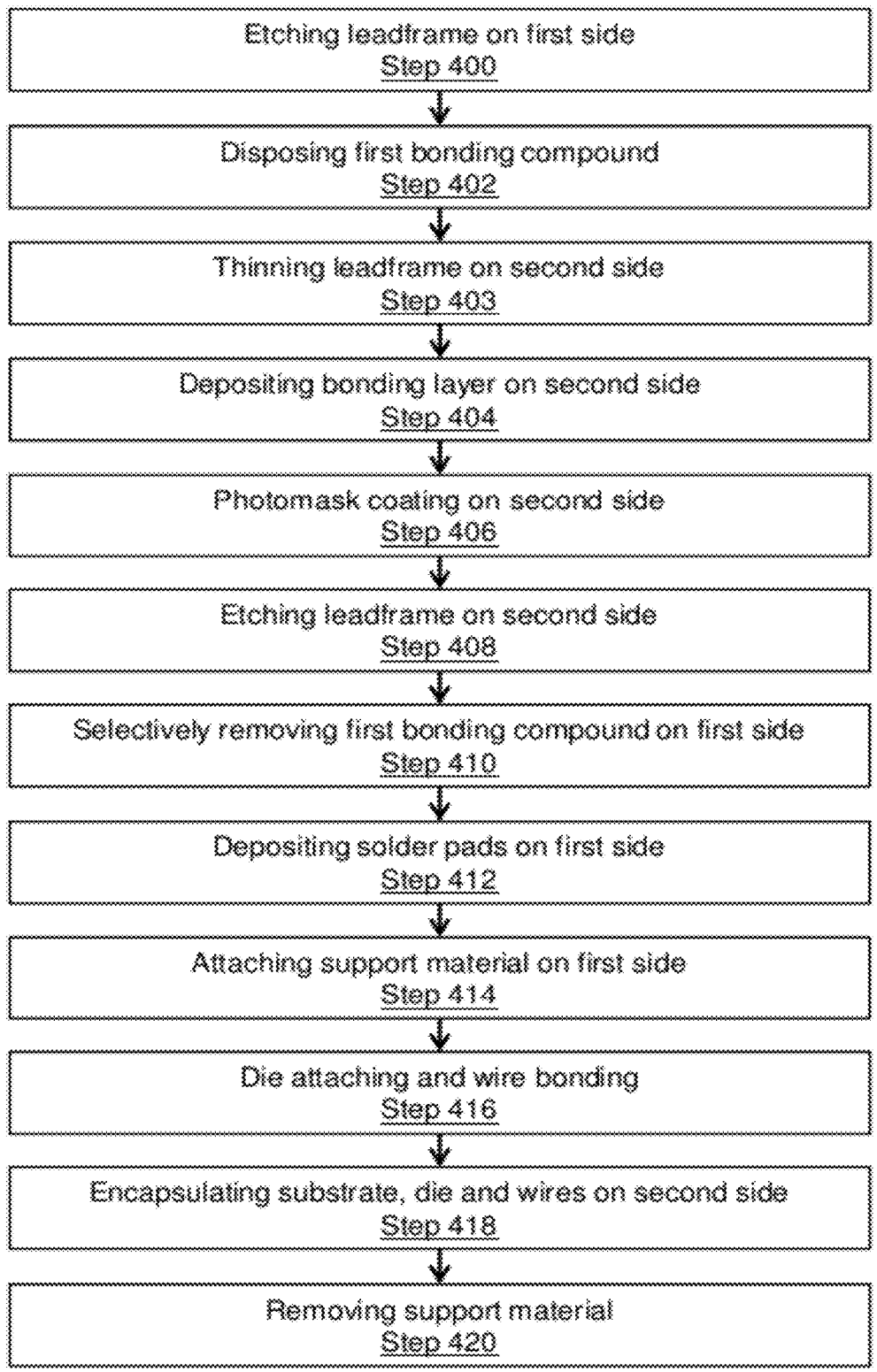
FIG. 7 is a flow chart of a process of manufacturing an integrated circuit chip package according to another embodiment of the present invention.

In another embodiment of the present invention as shown in FIG. 6k, the IC package comprises an electrically conductive lead frame leadframe 20. The leadframe 20 comprises a plurality of lands 22 on a first side of the leadframe with a first recessed portion 24 between lands 22 and a plurality of routing leads 25 on a second side of the leadframe with a second recessed portion 27 between the routing leads 25. Each land 22 is electrically connected to a corresponding routing lead 25. A bonding pad 28 is disposed on a bonding site of each routing lead 25.

The IC package also comprises a first bonding compound 21 filling the first recessed portion 24. The IC package comprises a semiconductor die 30 with bonding wires 32 electrically connecting the semiconductor die 30 to the bonding pads 28, and an encapsulation compound 34 filling the second recessed portion 27, and also covering the plurality of routing leads 25, the plurality of bonding pads 28, the semiconductor die 30 and the bonding wires 32. The first bonding compound 21 contacts with the encapsulation compound 34 at areas common to the first recessed portion 24 and the second recessed portion 27. The IC package further comprises a support material 38 attached to the first side of the leadframe substrate, covering the first bonding compound 21 and the lands 22. The second support material 38 supports the substrate in the manufacturing process and is selected to be easily removable.

Figure 8L:
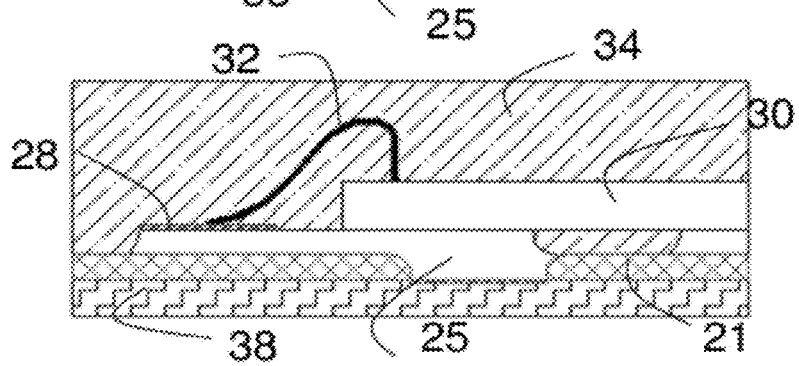
Figure 8M:
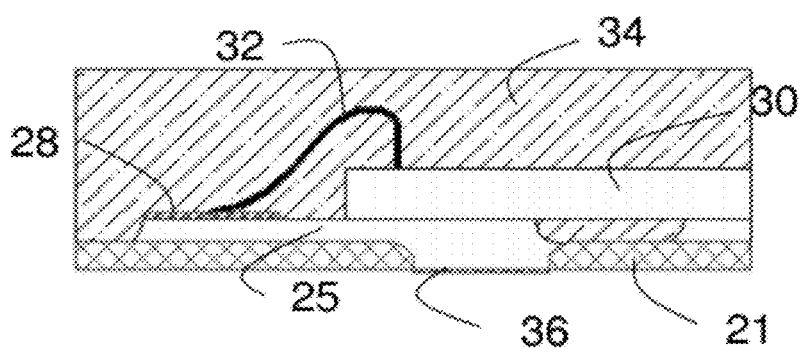
Figure 9:
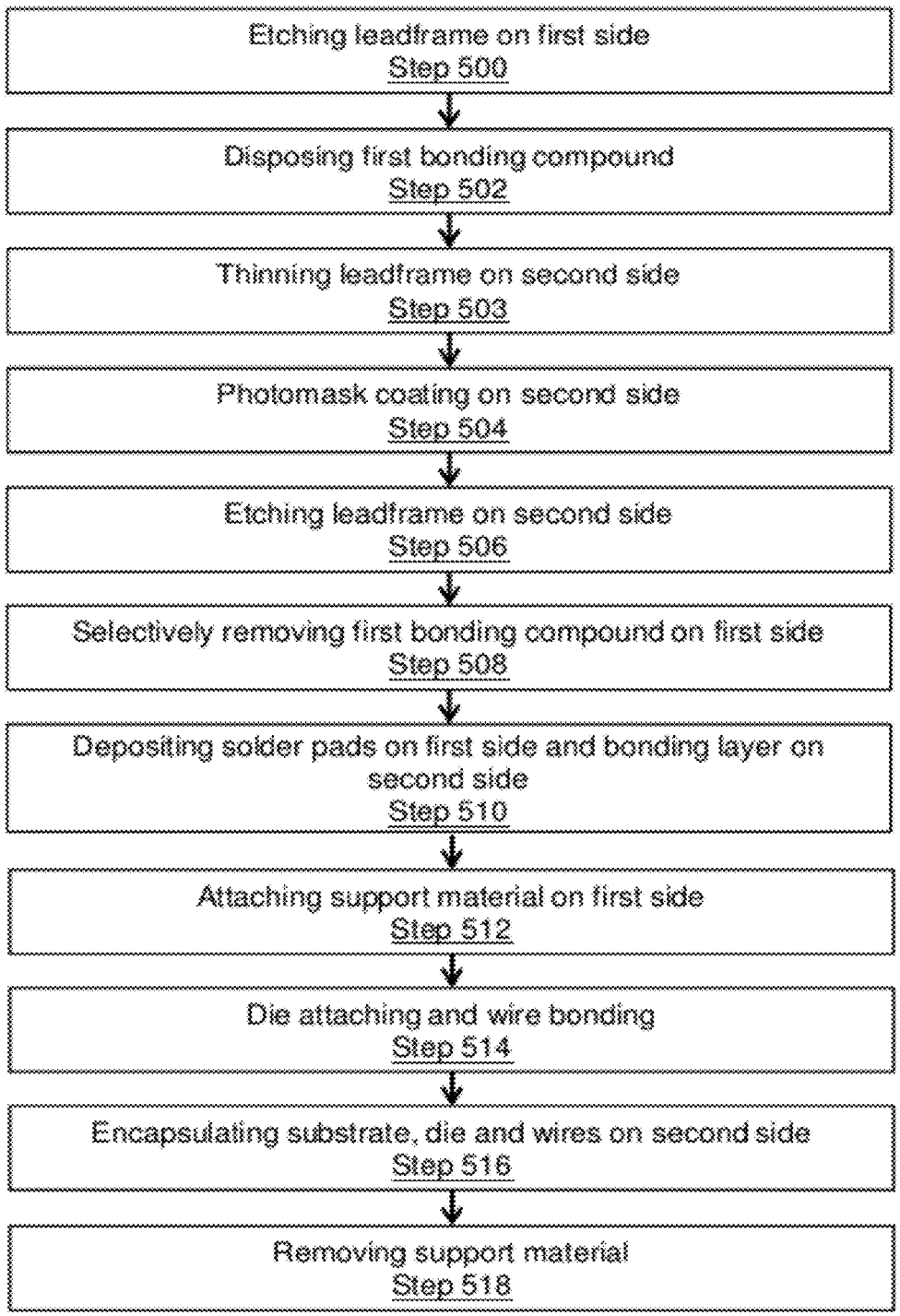
FIG. 9 is a flow chart of a process of manufacturing an integrated circuit chip package according to another embodiment of the present invention.

In another embodiment as shown in FIG. 8l, the IC package further comprises solder pads 36 disposed on the lands 22. The support material 38 covers the first bonding compound 21 and the solder pads 36. This IC package is ready for attaching to a PCB upon removing the support material 38 from the IC package.

Figure 12A:
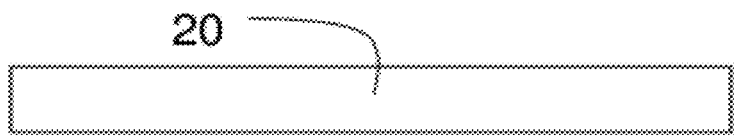
FIG. 12a-12k is a cross-sectional view of an integrated circuit chip package at different steps of the process of FIG. 11.
Figure 12B:
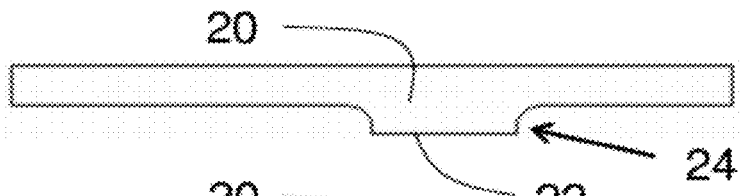
Figure 12C:
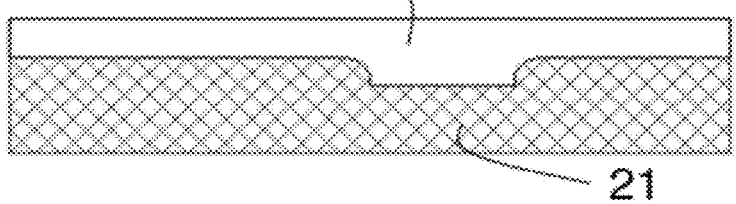
Figure 12D:
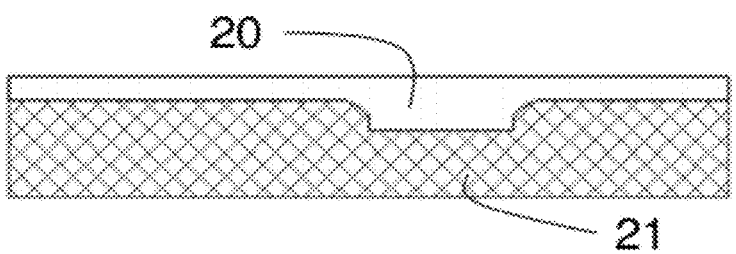
Figure 12E:
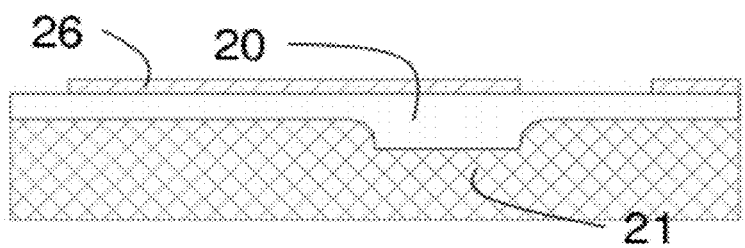
Figure 12F:
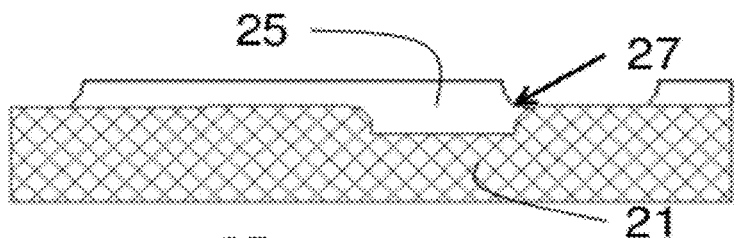
Figure 12G:
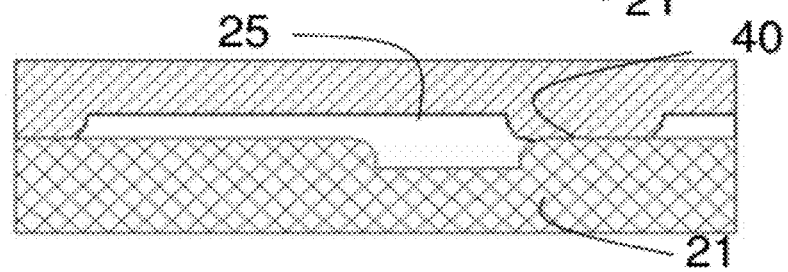
Figure 12H:
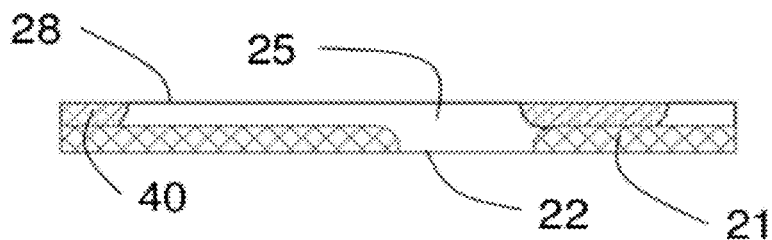
Figure 12I:
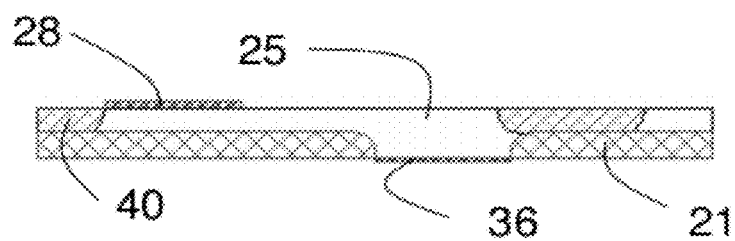
Figure 12J:
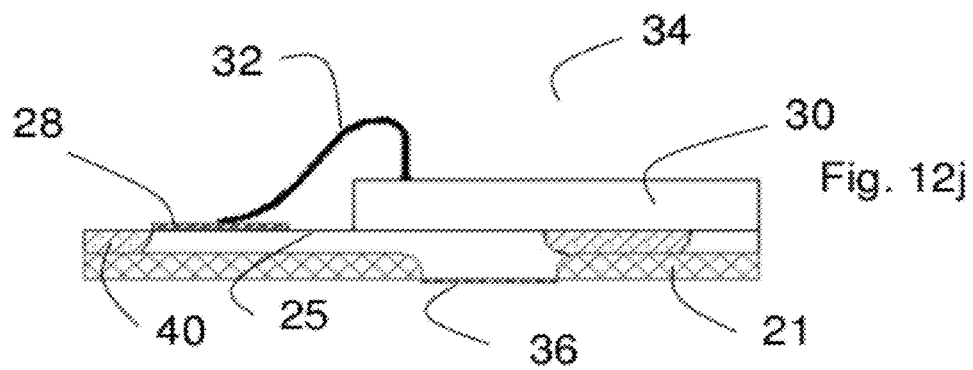
Figure 12K:
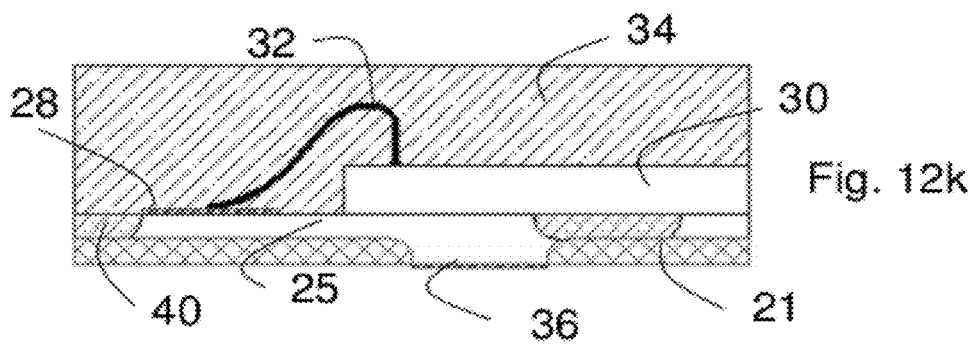

In yet another embodiment of the IC package as shown in FIG. 12k, the IC package comprises an electrically conductive lead frame leadframe 20. The leadframe 20 comprises a plurality of lands 22 on a first side of the leadframe with a first recessed portion 24 between lands 22 and a plurality of routing leads 25 on a second side of the leadframe with a second recessed portion 27 between the routing leads 25. Each land 22 is electrically connected to a corresponding routing lead 25. A bonding pad 28 is disposed on a bonding site of each routing lead. A solder pad 36 is disposed on each land 22.

The IC package also comprises a first bonding compound 21 filling the first recessed portion 24, and a second bonding compound 40 filling the second recessed portion 27. The first bonding compound 21 is in contact with the second bonding compound 40 at areas common to the first recessed portion 24 and the second recessed portion 27. The IC package comprises a semiconductor die 30 with bonding wires 32 electrically connecting the semiconductor die 30 to the bonding pads 28, and an encapsulation compound 34 covering the second bonding compound 40, the plurality of bonding pads 28, the semiconductor die 30 and the bonding wires 32. The IC package is ready to be bonded to an external printed circuit board through the solder pads 36.

In one embodiment, the IC package also comprises a die attach material in a predetermined area between the second side of the leadframe 20 and the semiconductor die 30. In one embodiment, the die attach material is provided on the routing leads 25 within the predetermined area of the leadframe 20. In another embodiment, the die attach material is provided on the routing leads 25 and also fills the second recessed portion 27 between the routing leads 25 within the predetermined area.

Figure 13:
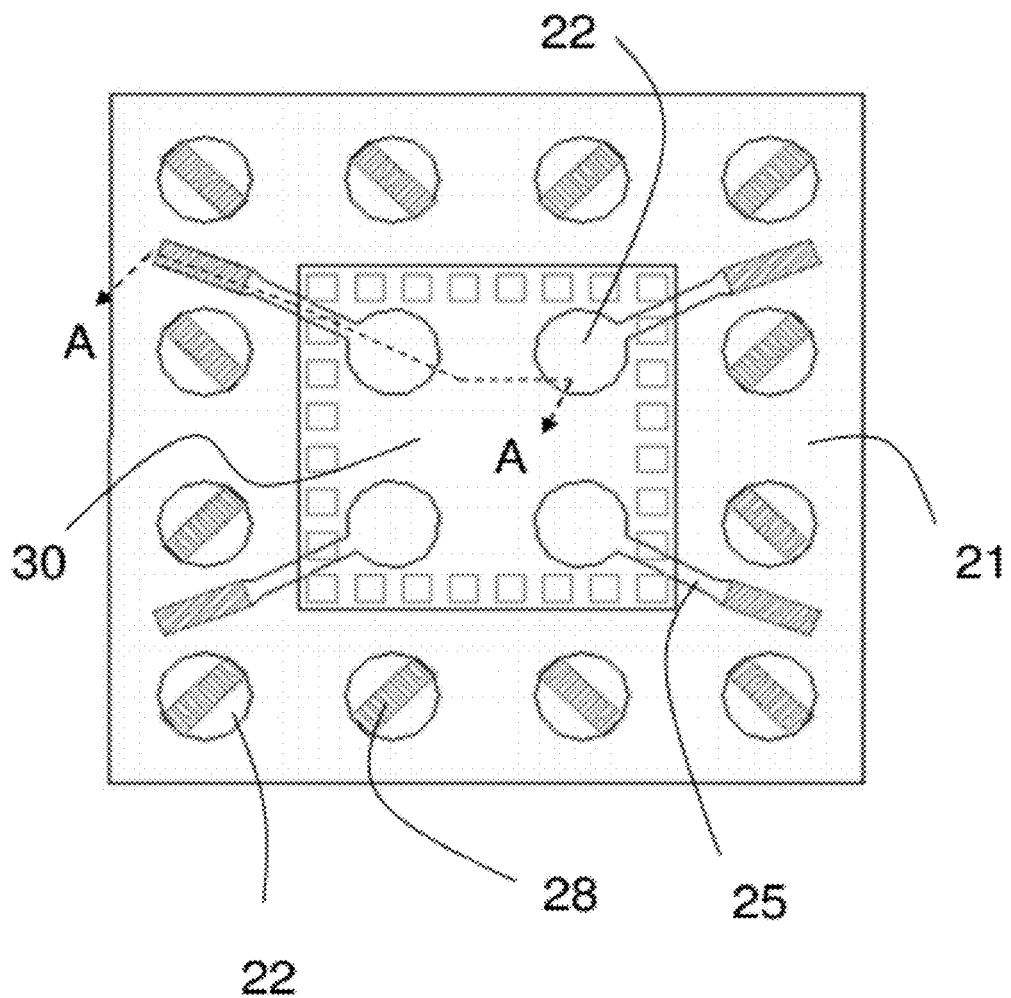
FIG. 13 is a top view of the substrate at FIG. 2g.

In another aspect of the invention, a substrate for manufacturing an IC package is provided. A top view of the substrate is shown in FIG. 13, where the cross section along the line A-A is shown in FIG. 2g. The expected area for attachment of the semiconductor die is also shown in FIG. 13 for reference. The substrate comprises an electrically conductive leadframe 20. The leadframe 20 comprises a plurality of lands 22 on a first side of the leadframe with a first recessed portion 24 between lands 22 and a plurality of routing leads 25 on a second side of the leadframe with a second recessed portion 27 between the routing leads 25. Each land 22 is electrically connected to a corresponding routing lead 25. A bonding pad 28 is disposed on a bonding site of each routing lead 25. The substrate further comprises a first bonding compound 21, the first bonding compound 21 having a first portion filling the first recessed portion 24, and a second portion covering the first portion and the lands 22 at the first side of the leadframe 20. The first bonding compound 21 is exposed at the second side of the leadframe 20 at areas common to the first recessed portion 24 and the second recessed portion 27.

In another embodiment as shown in FIG. 6i, the first bonding compound 21 only has a first portion filling the first recessed portion 24. The substrate further comprises a support material 38 covering the first bonding compound 21 and the lands 22 at the first side of the leadframe 20.

In another embodiment as shown in FIG. 8j, the substrate further comprises solder pads 36 disposed on the lands 22. The support material 38 covers the first bonding compound and the solder pads 36 at the first side of the leadframe.

In yet another embodiment as shown in FIG. 12i, the substrate comprises an electrically conductive leadframe 20. The leadframe 20 comprises a plurality of lands 22 on a first side of the leadframe 20 with a first recessed portion 24 between lands 22 and a plurality of routing leads 25 on a second side of the leadframe 20 with a second recessed portion 27 between the routing leads 25. Each land 22 is electrically connected to a corresponding routing lead 25. A bonding pad 28 is disposed on a bonding site of each routing lead 25. The substrate further comprises a first bonding compound 21, the first bonding compound 21 having a first portion filling the first recessed portion 24. The substrate also comprises a second bonding compound 40 filling the second recessed portion 27. The second bonding compound 40 is in contact with the first bonding compound 21 at areas common to the first recessed portion 24 and the second recessed portion 27.

In one embodiment, the IC package also comprises a die attach material in a predetermined area on the second side of the leadframe 20. In one embodiment, the die attach material is provided on the routing leads 25 within the predetermined area of the leadframe 20. In another embodiment, the die attach material is provided on the routing leads 25 and also fills the second recessed portion 27 between the routing leads 25 within the predetermined area. In another embodiment, a first die attach material is disposed on the routing leads 25 and a second die attach material is provided filling the second recessed portion 27.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

For example, the first bonding compound 21 can also be removed by other means than mechanical polishing to expose the lands 22, such as etching.

Although the embodiments showed that the steps are performed in a particular sequence, one skilled in the art can modify the sequence to his desire without departing from the scope of the invention. For example, it is known to one skilled in the art that solder pads 36 can be disposed at any stage where the lands 22 are exposed, for example after selectively removing the first bonding compound 21, or after attaching and removing the support material 38.

In one embodiment, the bonding pads 28 are disposed before the defining of the routing leads 25. In such case, the bonding pads 28 can be disposed using electrolytic plating in addition to electroless plating technique.

In one embodiment, the first portion and the second portion of the first bonding compound 21 is disposed in separate steps instead of in a single step.

Figure 20A:
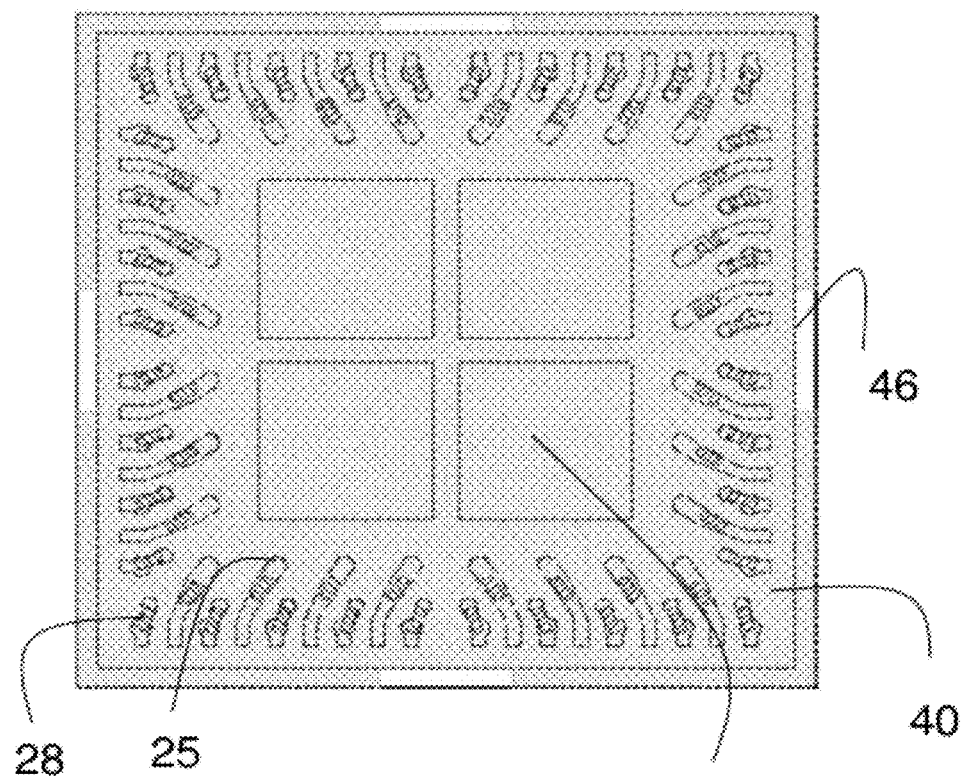
FIG. 20a is a top view of a substrate showing a selectively disposed second bonding compound, according to an embodiment of the present invention.
Figure 20B:
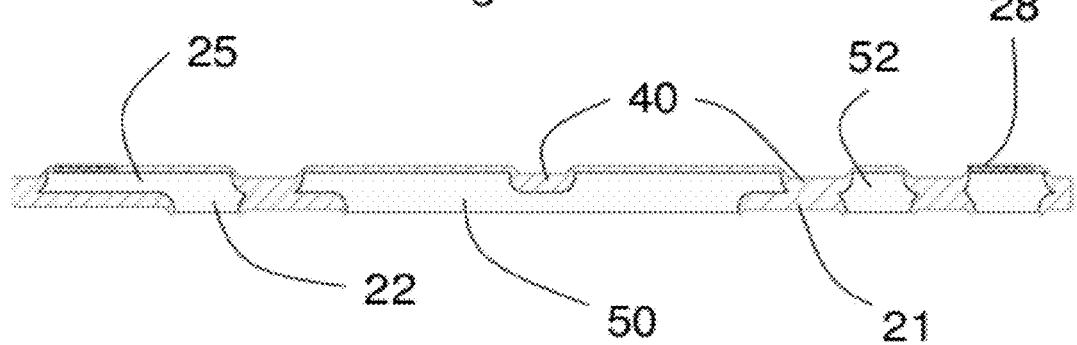

In another embodiment as shown in FIGS. 20*a* and 20*b*, a top view and a cross-sectional view of a substrate with selective deposition of a photolithographic material e.g. solder mask as the second bonding compound 40 is shown. In this embodiment, the leadframe 20 of the substrate comprises a plurality of lands 22 on a first side of the leadframe 20 with a first recessed portion 24 between the lands 22. The leadframe 20 also comprises a plurality of electrically insulated bonding sites or bonding points 52 (in dwg 20*a* move line indicator for 52 to top of trace) on the second side of the leadframe 20 with a second recessed portion 27 between the bonding points 52. Each land 22 is either electrically connected to a corresponding bonding point 52 directly or through a routing lead 25.

A second bonding compound 40 is disposed on a predetermined or selected area of the second side of the leadframe 20. The second bonding compound 40 either partially or completely fill the second recessed portion 27 within the predetermined area according to user needs. The second bonding compound 40 is also deposited on the surface of the second side of the leadframe 20 in areas where leadframe material is not removed, such as die attach pad 50. The second bonding compound 40 is provided for holding the plurality of bonding points 52 together, preventing displacement of any bonding point 52 during IC packaging process And to fill the recesses formed by the $2^{nd}$ or top etch.

On the other hand, the second side of the leadframe 20 is exposed outside the predetermined area. In this embodiment, the exposed area comprises the surface of the plurality of bonding points 52. "Surface" here means the surface along a plane parallel to the first or second surface of the leadframe 20. The bonding points 52 are plated with bonding pads 28 for bonding to a semiconductor die through bonding wires.

As mentioned above, the second bonding compound 40 is only disposed on selected areas and not disposed on other areas. To selectively dispose or expose the second bonding compound 40, the second bonding compound 40 must be easily assumed a desired shape. While using epoxy material provides better holding strength, the shape of the epoxy have to be first decided by a shape of the mold or stencil during application process, and further change in shape of the epoxy can only be done by mechanical polishing, which is heavily limited in the way which the shape can be changed. For example, a non-planar contour or selective disposing on a predetermined area is difficult to be achieved using epoxy material.

In an exemplary embodiment of the present invention, the second bonding compound 40 is made of a photolithographic material or "solder mask" such as poly(methyl methacrylate) (PMMA), poly(methyl glutarimide) (PMGI) etc. Such photolithographic material can be applied onto the leadframe surface, then selectively disposed or exposed using conventional techniques to result in a leadframe surface with predetermined covered areas. The solder mask fills the recesses and can protect the bonding points or routing leads from electrically shorting when a conductive die attach material is used, as such enhancing the thermal performance of the substrate. In one embodiment, the solder mask has a fixed thickness, therefore the profile of the solder mask is non-planar when the solder mask covers some of the recessed portions and some of the unetched portions such as routing leads.

Figures 21A, 21B:
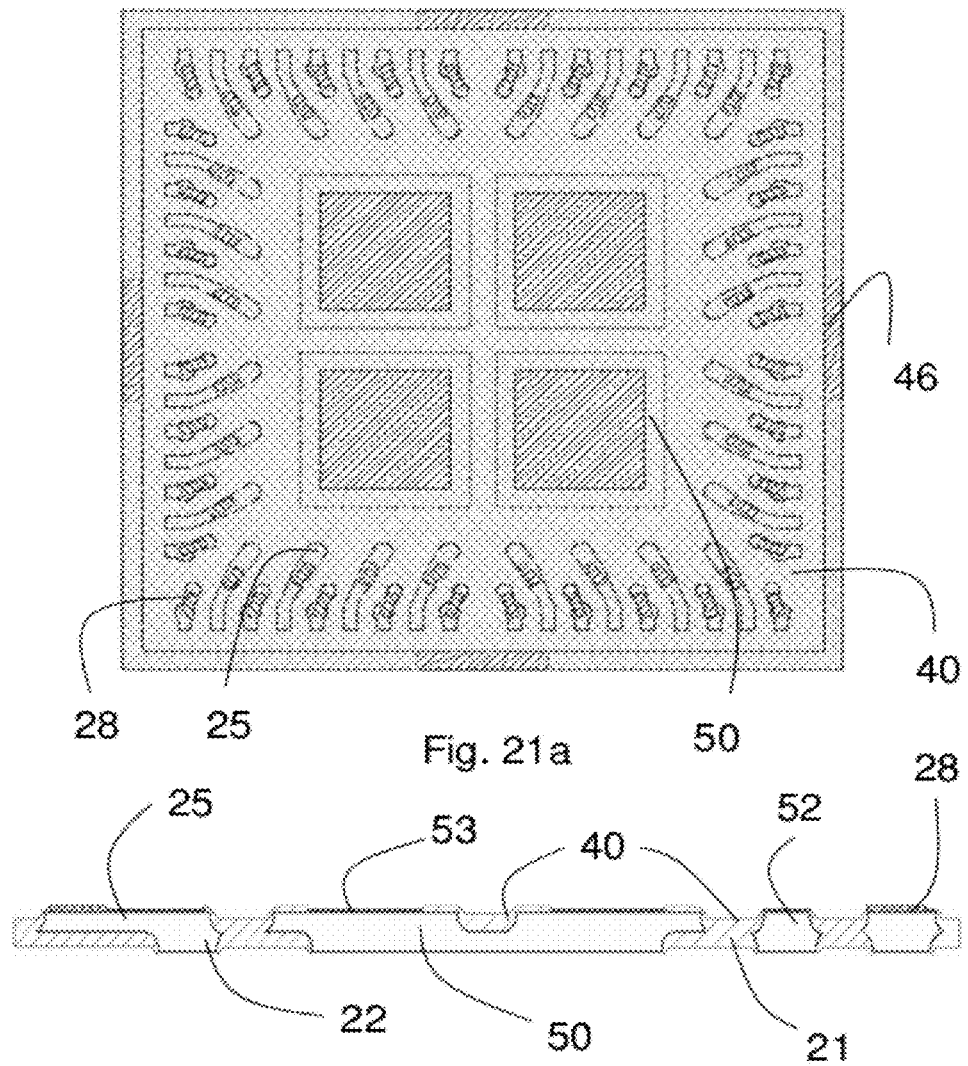

In another exemplary embodiment as shown in FIGS. 21*a* and 21*b*, the exposed area comprises the surfaces of the bonding points 52 and also the routing leads 25. The bonding points 52 are plated with the bonding pads 28, while the routing leads 25 are exposed to the environment and will contact the encapsulation compound during encapsulation process. In a further embodiment, the exposed surface of the routing leads 25 is subjected to an adhesion enhancement treatment to provide additional holding strength to the encapsulation compound. In one embodiment, the treatment is a mechanical roughening of leadframe material by a roughening agent. In another embodiment, the treatment is a chemical roughening of leadframe material such as microetch. In yet another embodiment, the treatment is a disposition of a rough coating on the leadframe material. A combination of the above processes is also possible in different embodiments.

Figure 22A:
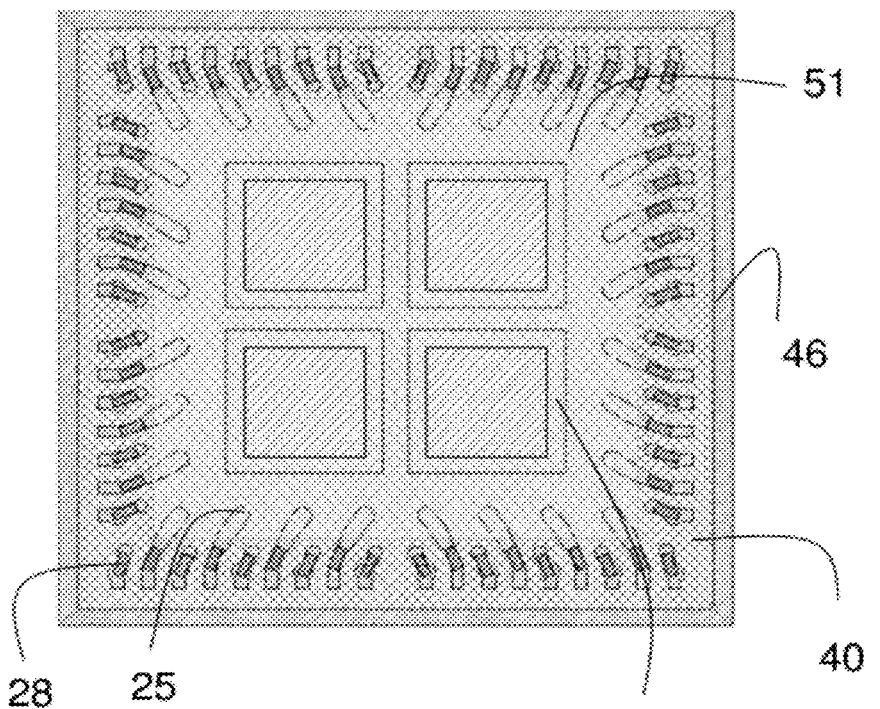
FIG. 22a is a top view of a substrate showing a selectively disposed second bonding compound, according to yet another embodiment of the present invention.
Figure 22B:
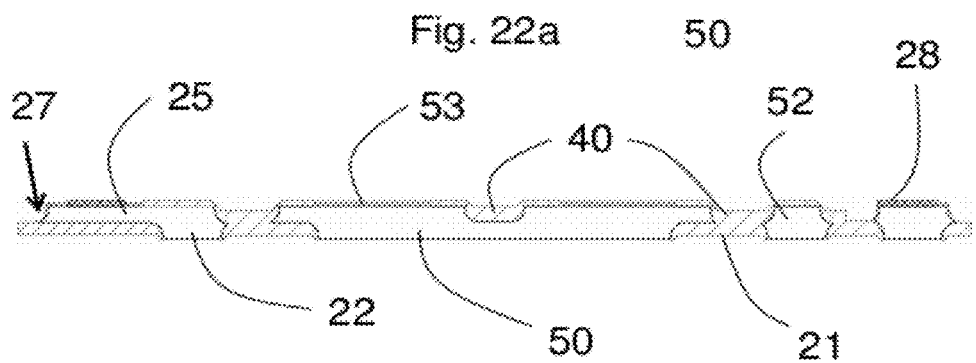

In another exemplary embodiment as shown in FIGS. 22*a* and 22*b*, the second bonding compound 40 is disposed on a center portion of the leadframe 20 where the semiconductor die will be attached thereon, which is hereby referred to as die attach area 51. The second recessed portion 27 within this die attach area 51 is completely filled by the second bonding compound 40. As shown in FIG. 22*a*, the leadframe 20 also comprises a die attach pad 50 within the die attach area 51. The leadframe 20 outside of this die attach area is exposed to the environment, such as the routing leads 25 and the second recessed portion 27 outside of the die attach area 51, including the side surfaces of the routing leads 25.

In a further embodiment, the exposed areas on the second side of the leadframe 20 are also subjected to adhesion enhancement treatment to improve holding strength to the encapsulation compound. This embodiment has a larger exposed area than the above two embodiments, thus the effect of adhesion enhancement treatment is more substantial.

In one embodiment, a first bonding compound 21 is disposed on the first side of the leadframe 20, filling the first recessed portion 24. The lands 22 are exposed from the first bonding compound 21 for electrical connection to other elements. In different embodiments, the first bonding compound 21 can be either an epoxy material or a photolithographic material.

In another embodiment, a support ring 46 is provided surrounding the leadframe 20, including each and every land 22 and bonding point 52. The first bonding compound 21 and/or the second bonding compound 40 extend from the perimeter of the leadframe 20 to the support ring 46. The support ring 46 provides additional strength for the bonding compounds for holding the leadframe 20 together during manufacturing. As shown in FIG. 21*a*, portions of the support ring 46 can also be subjected to adhesion enhancement treatment for improved adhesion with the encapsulation compound.

In one embodiment, the substrate comprises a die attach pad 50 extending from the first side of the leadframe to the second side of the leadframe. The die attach pad 50 is partitioned into a plurality of sectors on the first side, the second side or both sides of the leadframe 20. An area between adjacent partitions is etched away to form a part of the first recessed portion 24 or the second recessed portion 27. As an example, in FIG. 20*a* the die attach pad 50 is partitioned on the second side of the leadframe into four square sectors with identical shape. The second bonding compound 40 is disposed in the area between adjacent sectors to secure the die attach pad within the leadframe.

This configuration of die attach pad 50 increases the surface area of contact between the bonding compound and the die attach pad 50, thus improving the holding strength of the bonding compound towards the die attach pad 50. The recessed portion between adjacent sectors does not need to be of the same depth as the first or second recessed portion, as the adjacent partitions do not need to be electrically isolated from each other. Also, as more leadframe material is removed, the thermal performance of the substrate would decrease since the amount of leadframe material left in the die attach pad 50 is reduced.

In a further embodiment for example as shown in FIG. 21*a*, the second bonding compound 40 on a center portion of each sector of the die attach pad 50 is selectively removed, and the exposed area is subjected to adhesion enhancement treatment as mentioned above. This configuration provides improved adhesion of the material securing the die to the leadframe and to the encapsulation compound while not compromising the holding strength of the bonding compound.

In another embodiment, the die attach pad 50 is only partitioned on the first side but not on the second side. The exposed portion of the die attach pad 50 on the second side may also be subjected to the adhesion enhancement treatment. This configuration maximizes the adhesion performance while still provides increased surface area on the first side for the first bonding compound 21 to hold onto.

Figure 23:
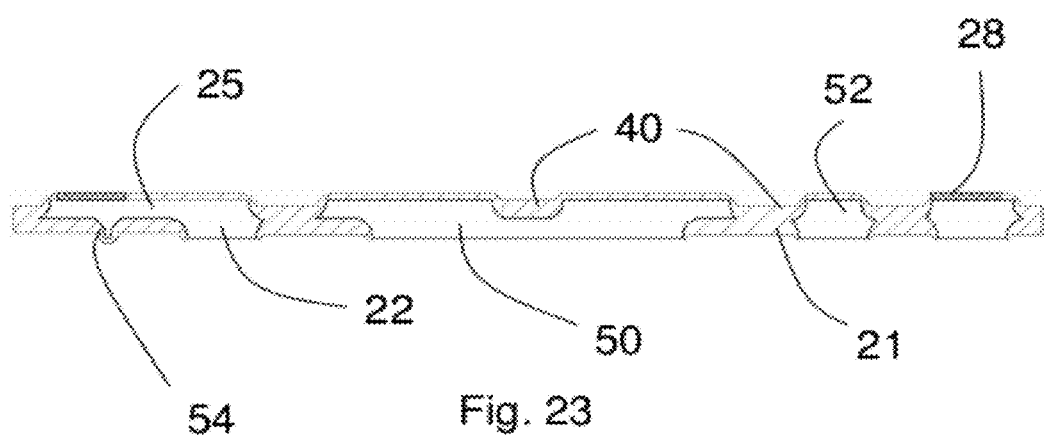
FIG. 23 is a cross-sectional view of a substrate with a pedestal structure in a routing lead, according to an embodiment of the present invention.

In another aspect of the invention as shown in FIG. 23, a substrate for IC package with a pedestal structure is disclosed. In one embodiment, the leadframe 20 of the substrate comprises a plurality of lands 22 on a first side of the leadframe 20 with a first recessed portion 24 between the lands 22. The leadframe 20 also comprises a plurality of electrically insulated bonding points 52 on the second side of the leadframe 20 with a second recessed portion 27 between the bonding points 52. The lands 22 are not disposed directly opposite to the bonding points 52. Each land 22 is electrically connected to a corresponding bonding point 52 through a routing lead 25. Bonding pads 28 are plated on each of the bonding points 52 for bonding to a semiconductor die through bonding wires.

In this embodiment, a pedestal structure 54 made of leadframe material is formed extending towards the first side of the leadframe 20 directly opposite to at least one of the bonding points 52. In an exemplary embodiment, a distal end of the pedestal structure 54 is coplanar to the lands 22, and the pedestal structure 54 has a concave profile along its side surfaces. A proximal end of the pedestal structure is at the deepest part of the first recessed portion 24. In another embodiment, the pedestal structure 54 has an undercut along its side surfaces, meaning that a cross-sectional area of the pedestal structure 54 along its side surface is smaller than that at the distal end. A first bonding compound 21 is disposed in the first recessed portion 24, and is also disposed on the side surface and the distal end of the pedestal structure 54.

In another embodiment, the pedestal structure 54 is also disposed directly opposite to the routing lead 25 along at least one routing lead 25.

The pedestal structure 54 provides more surface area for the first bonding compound 21 to hold onto the substrate, thereby enhancing performance for the first bonding compound 21. By forming the pedestal structure directly opposite to the bonding point 52, the first bonding compound 21 when disposed can prevent the bonding point 52 to bend away from the substrate, resulting in displacement of the bonding point 52 during subsequent processes and thus reducing yield. Also, as the bonding point 52 typically has a greater width than the routing lead 25, a pedestal structure 54 located directly opposite to the bonding point can have more surface area and larger volume. The pedestal structure 54 also moves the center of gravity of the lead towards the first side of the leadframe 20, increasing the stability of the substrate. Covering the distal end of the pedestal structure 54 prevents unintended electrical connection when the substrate is bonded onto a circuit board therebelow.

In an exemplary embodiment, the first bonding compound 21 is a photolithographic material. The photolithographic material can be coated on the first side of the leadframe 20 irrespective of the contour thereof, meaning that extra steps do not have to be done to ensure the distal end of the pedestal structure 54 is covered. In another embodiment, the first bonding compound 21 is an epoxy material, but a thin layer of photolithographic material has to be coated on top of the distal end after the excess epoxy is removed to ensure electrical isolation of the pedestal structure 54.

Figure 24:
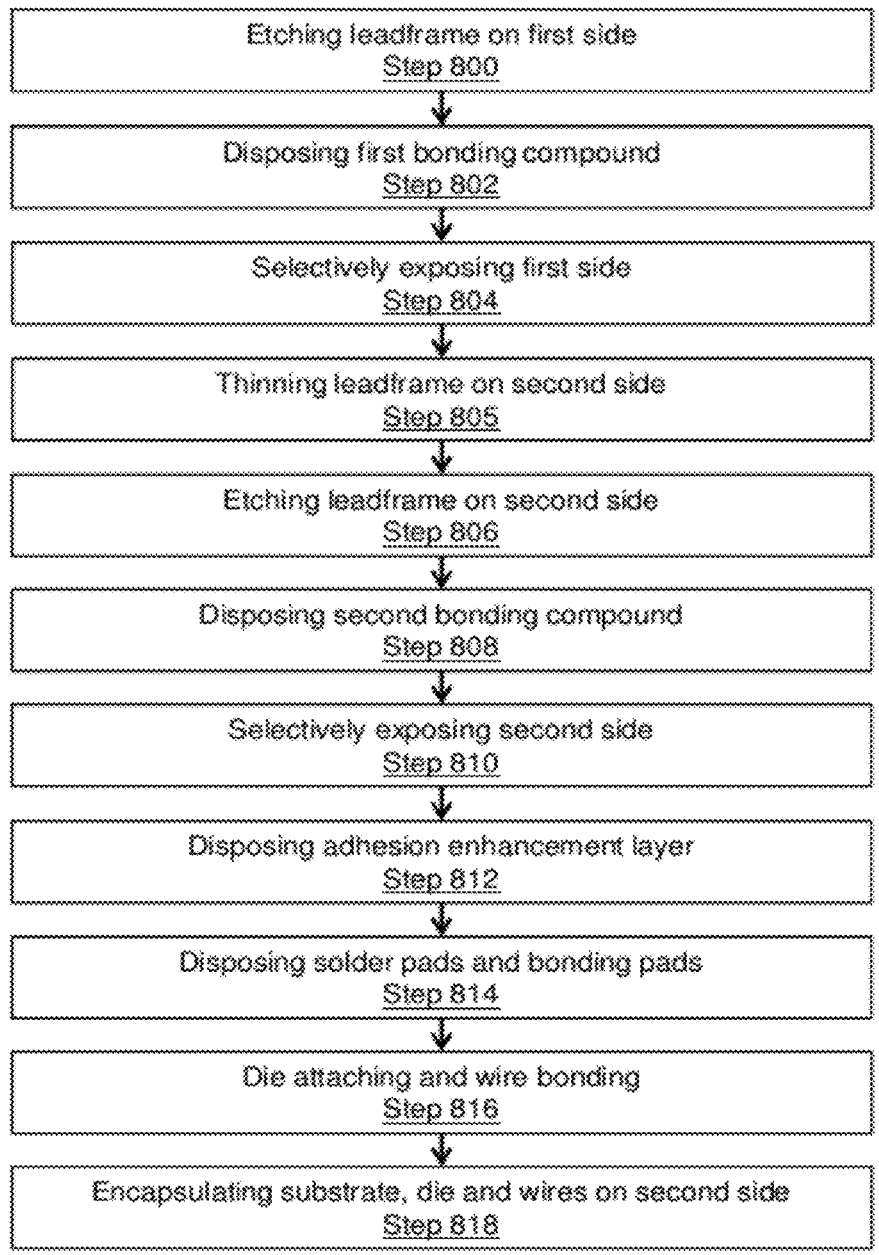
FIG. 24 is a flow chart for manufacturing the substrate in FIGS. 20-23.

FIG. 24 shows a flow chart of a method of manufacturing the substrate as shown in FIGS. 20 to 23. The leadframe is first etched on the first side (step 800). The lands, the pedestal structure and the first side of the die attach pad are formed in this step. Then, the first bonding compound is disposed (step 802). It is assumed here that the first bonding compound is a photolithographic material. The first side is then selectively exposed (step 804) to expose the lands 22 but still covering the pedestal structure and the die attach pad.

The leadframe is then optionally thinned on the second side (step 805). The second side then goes through the similar steps as above (steps 806, 808 and 810). The second bonding compound is a photolithographic material. The bonding points, the routing leads and the second side of the die attach pad are formed. Afterwards, the bonding points and the areas as mentioned in the description to FIGS. 20-22 above are selectively exposed. The adhesion enhancement layer (step 812), along with the solder pads and bonding pads (step 814) are then disposed onto the leadframe to finish the substrate. The remaining steps for manufacturing the IC package (die attaching, wire bonding, encapsulating etc.) are the same as the above embodiments (steps 816 and 818).

It is obvious to one skilled in the art that the order of the steps in the flow chart in FIG. 24 can be changed without affecting the final product. For example, the steps for making the first side and the second side of the substrate are independent to each other and one can start manufacturing the substrate from the second side instead of the first side. In one embodiment, the side with epoxy material as the bonding compound is first manufactured to minimize warpage of the substrate during subsequent processing. The solder pads and bonding pads can also be disposed before the adhesion enhancement layer.

Figure 25A:
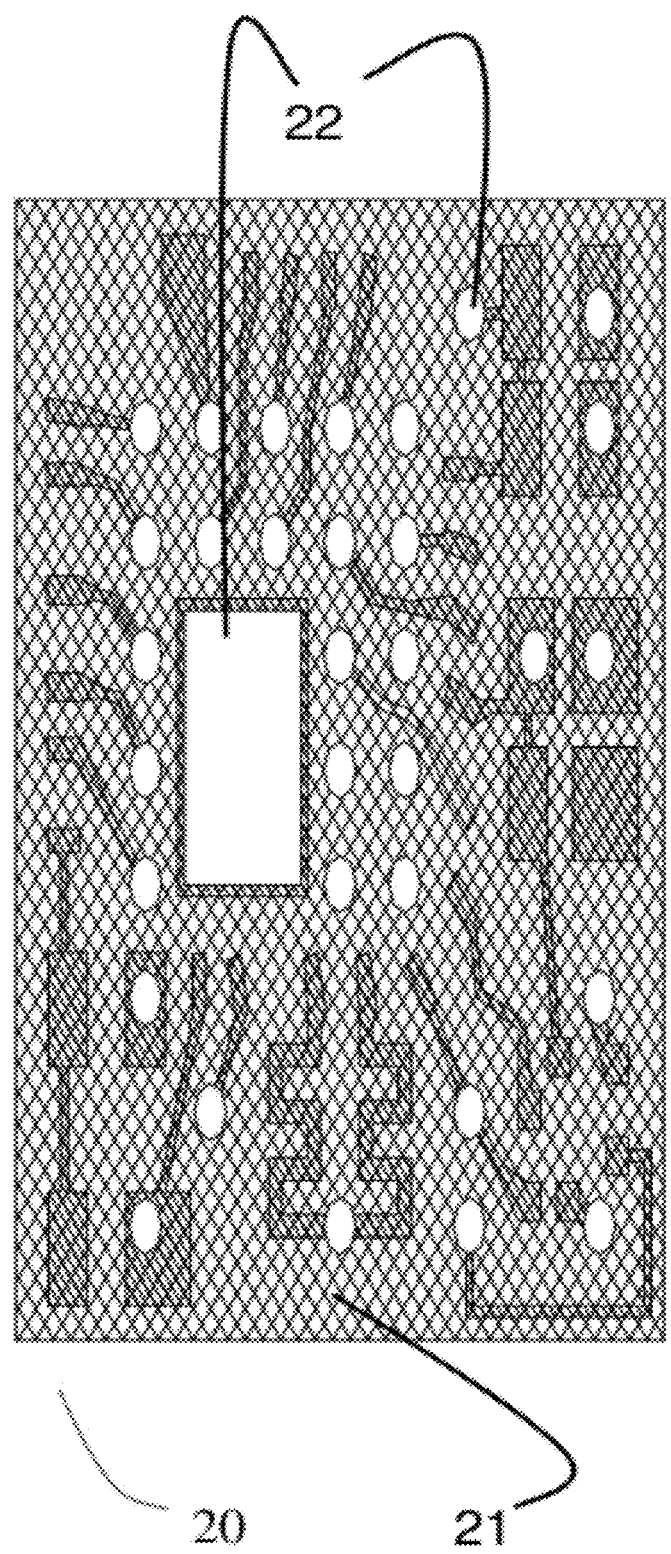
FIG. 25a is a bottom view of a System-in-Package device according to an embodiment of the present invention.
Figure 25B:
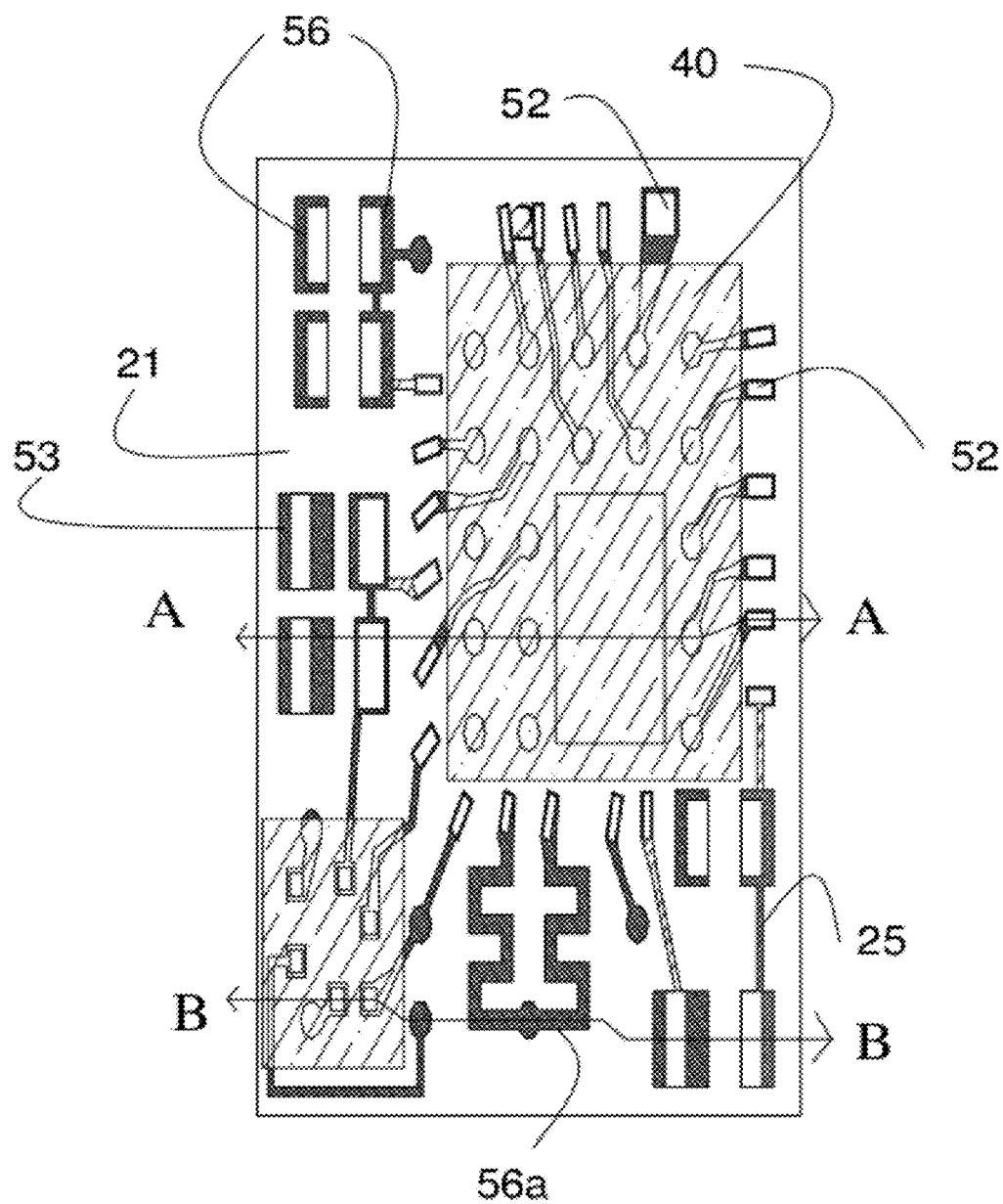
Figure 25C:
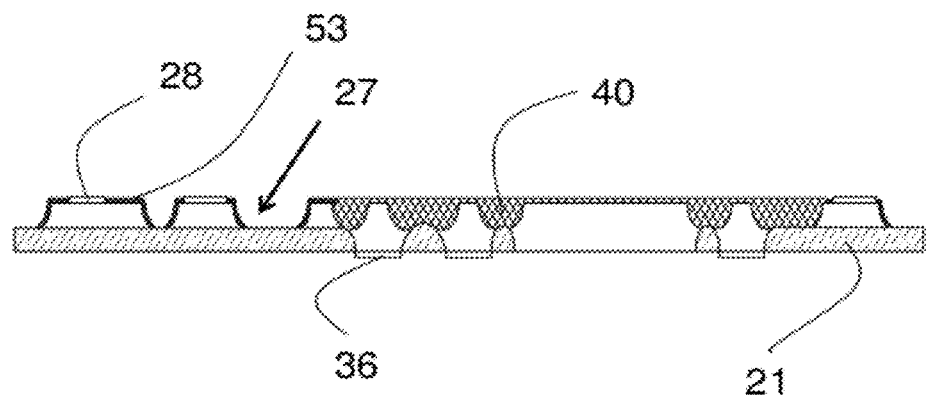
FIG. 25c is a cross sectional view of the device of FIG. 25b along the line A-A.

In another embodiment of the present invention as shown in FIGS. 25*a* to 25*d*, a System in Package (SIP) device utilizing the selective exposure of the second bonding compound 40 is disclosed. The first side of the leadframe 20 comprises a plurality of lands 22 with the first bonding compound 21 disposed between the plurality of lands 22. In addition to the bonding points 52 and routing leads 25, the second side of the leadframe 20 also comprises at least one electrically isolated feature (EIF) 56, with the second recessed portion 27 between the EIFs 56. Similar to the routing leads 25, the leadframe material between EIFs 56 is completely removed, such that the EIFs are electrically isolated to each other. The EIF 56 can be anything that can be manufactured using leadframe material, such as an antenna 56*a*, an inductor for RF tuning (not shown) and attachment sites for any type of active or passive component. Each EIF 56 can either comprise a bonding point 52 for bonding to a semiconductor die or other external devices, or routing leads 25 can be provided for connecting between EIFs 56, as shown in FIG. 25*b*.

In this embodiment, only the die attach area for the semiconductor die is selectively disposed with the second bonding compound 40, i.e. the area where the EIFs 56 are located is selectively exposed. The exposed leadframe material of the EIFs 56 can be subjected to adhesion enhancement treatment as described above.

Figure 25D:
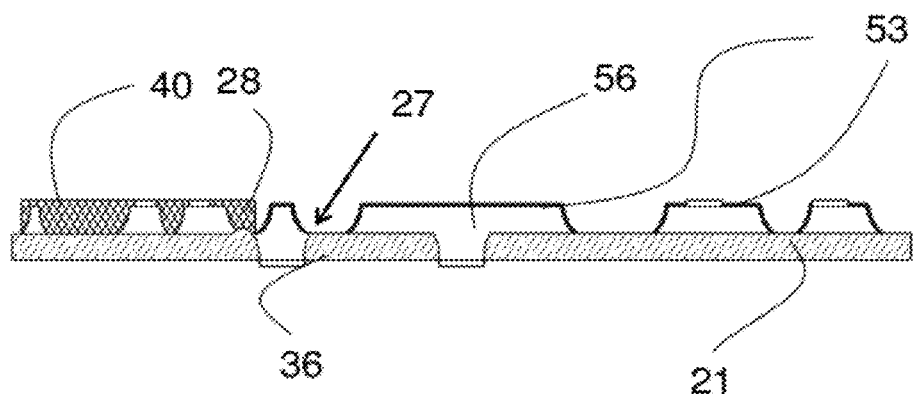
FIG. 25d is a cross sectional view of the device of FIG. 25b along the line B-B.

Also referring to FIGS. 25*b* and 25*d*, the present invention can also be utilized on a flip chip semiconductor die. Within the die attach area disposed with the second bonding compound 40, an opening is made to expose each bonding point 52. A bonding pad 28 may be disposed on the bonding point 52 based on the process used for the flip chip attachment for directly bonding to the semiconductor die.

In yet another embodiment, the second bonding compound 40 is also selectively disposed around bonding points 52 of an EIF 56. The second bonding compound 40 in this case is used for preventing solder material for bonding to the EIF 56 to flow to unintended areas and shorting the electrical circuit or into wire bond areas where it would prevent the wire bond process.

In one embodiment, the total depth of the etches from the first side and the second side combines to be greater of the thickness of the leadframe 20. For example, for a 5 mil thick leadframe 20, the first etch from the first side removes leadframe material of a first depth, for example 3 mil, i.e. first recessed portion 24 is 3 mil deep. At this stage, the etched areas have a remaining thickness of 2 mil extending from the second surface. The second etch from the second side would also remove 3 mil of leadframe material for example. If the area is not previously etched by the first etch, then the remaining thickness of this area is 2 mil extending from the first surface. If the area is already previously etched by the first etch, the remaining 2 mil of leadframe material will be removed to completely electrically isolate the leadframe material at the two sides of the recessed portion. The etchant will not etch away the first bonding compound disposed in the first recessed portion, so the etch will stop after 2 mil. The combined depth or total depth of the two etches are actually 6 mil deep to ensure that there is no leadframe material accidentally left on the areas where it should be completely electrically isolated.

It is understood that the substrates as mentioned in this invention are manufactured in a substrate strip where multiple substrates are arranged in a matrix format. In an exemplary embodiment, the substrate strip has a support ring surrounding the matrix of substrates. The support ring extends between the first surface and the second surface of the substrates, providing a physical structure for the first bonding compound and/or the second bonding compound to hold onto during manufacturing, which would improve the strength of the substrate and also reduce the warpage of the substrates (i.e. make the substrates flatter).

What is claimed is:

1. A substrate for an integrated circuit package, comprising:
   a) an electrically conductive leadframe having a first side and an opposing second side, said leadframe comprising:
      i. a plurality of lands on said first side;
      ii. a first recessed portion between said plurality of lands;
      iii. a plurality of electrically isolated bonding points on said second side, each bonding point being electrically connected to one of said plurality of lands;
      iv. a second recessed portion between said plurality of bonding points;
   b) a first bonding compound disposed in said first recessed portion and exposing said plurality of lands;
   c) a second bonding compound disposed in at least a portion of said second recessed portion, and selectively exposing a selected area of said leadframe on said second side;
   wherein said first bonding compound and said second bonding compound hold said plurality of bonding points and said plurality of lands together.

2. The substrate according to claim 1, wherein a profile of said second bonding compound is non-planar.

3. The substrate according to claim 1, wherein said second bonding compound is a photolithographic material, thereby allowing said selective exposure by development of said photolithographic material.

4. The substrate according to claim 1, wherein said second bonding compound selectively exposes said plurality of bonding points.

5. The substrate according to claim 1, wherein said leadframe further comprises at least one routing lead on said second side of said leadframe, each routing lead electrically connecting one of said plurality of bonding points to one of said plurality of lands, wherein said second bonding compound selectively exposes said at least one routing lead.

6. The substrate according to claim 1, wherein said selected area is subjected to an adhesion enhancement treatment.

7. The substrate according to claim 6, wherein said adhesion enhancement treatment comprises one of mechanical roughening, chemical roughening and deposition of a rough coating or a combination there of.

8. The substrate according to claim 1, wherein said second bonding compound is selectively exposed outside a die attach area adapted for a semiconductor die to attach thereon, thereby exposing said bonding points and said second recessed portion outside said die attach area.

9. The substrate according to claim 8, wherein said selected area is subjected to an adhesion enhancement treatment.

10. The substrate according to claim 1, wherein said leadframe further comprises a die attach pad extending between said first side and said second side, said die attach pad being partitioned into a plurality of sectors on at least one of said first side and said second side, with a recessed portion formed between adjacent sectors, wherein a bonding compound is disposed in said recessed portion, said bonding compound being one of said first bonding compound or said second bonding compound.

11. The substrate according to claim 10, wherein said second bonding compound selectively exposes a center portion of each said section of said die attach pad on said second side.

12. The substrate according to claim 1, wherein said leadframe further comprises at least one pedestal structure extending towards said first side of said leadframe, wherein a distal end thereof is coplanar to said plurality of lands and covered by said first bonding compound.

13. The substrate according to claim 12, wherein each said pedestal structure is formed directly opposite to one of said plurality of bonding points.

14. The substrate according to claim 12, wherein said pedestal structure comprises an undercut along at least one side surface thereof.

15. A method of manufacturing a substrate for an integrated circuit package, comprising the steps of:
   a) patterning a leadframe on a first side forming a plurality of lands and a first recessed portion between said plurality of lands;

b) disposing a first bonding compound on said first side of said leadframe, said first bonding compound filling said first recessed portion and exposing said plurality of lands;
c) patterning said leadframe on an opposing second side forming a plurality of electrically isolated bonding points and a second recessed portion between said plurality of bonding points;
d) disposing a second bonding compound on said second side of said leadframe, said second bonding compound filling at least a portion of said second recessed portion and selectively exposing a selected area on said second side of said leadframe;
wherein said first bonding compound and said second bonding compound hold said plurality of bonding points and said plurality of lands together.

16. The method according to claim 15, further comprising the step of subjecting said selected area to an adhesion enhancement treatment.

17. The method according to claim 15, wherein said step of patterning said first side of said leadframe further forms a pedestal structure.

18. The method according to claim 17, wherein said pedestal structure is formed directly opposite to one of said plurality of bonding points.

19. The method according to claim 15 wherein said second bonding compound is a photolithographic material, wherein said photolithographic material is developed to selectively expose said selected area.

20. The method according to claim 15, wherein said second bonding compound is selectively exposed outside a die attach area adapted for a semiconductor die to attach thereon, thereby exposing said bonding points and said second recessed portion outside said die attach area.

21. The substrate according to claim 1, wherein said second side of said substrate further comprises at least one electrically isolated feature, said second recessed portion separating said at least one electrically isolated feature.

22. The substrate according to claim 21, wherein said second bonding compound selectively exposes said at least a part of one electrically isolated feature.

23. The substrate according to claim 21, wherein said second bonding compound is selectively disposed around a bonding point of said at least one electrically isolated feature.

24. The substrate according to claim 21, wherein said second side of said substrate further comprises a routing lead connecting between said at least one electrically isolated feature.

* * * * *